(12) United States Patent
Motamed et al.

(10) Patent No.: US 7,639,045 B2
(45) Date of Patent: Dec. 29, 2009

(54) BI-DIRECTIONAL BUFFER AND METHOD FOR BI-DIRECTIONAL BUFFERING THAT REDUCE GLITCHES DUE TO FEEDBACK

(75) Inventors: Ali Motamed, San Jose, CA (US); Subrat Mohapatra, San Jose, CA (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 12/177,736

(22) Filed: Jul. 22, 2008

(65) Prior Publication Data

US 2009/0289693 A1    Nov. 26, 2009

Related U.S. Application Data

(60) Provisional application No. 61/055,774, filed on May 23, 2008, provisional application No. 61/055,777, filed on May 23, 2008.

(51) Int. Cl.
*H03K 19/094*    (2006.01)
*H03K 19/0175*    (2006.01)

(52) U.S. Cl. ............................. 326/86; 326/82; 326/83; 326/90

(58) Field of Classification Search ........................ None
See application file for complete search history.

(56) References Cited

U.S. PATENT DOCUMENTS

| | | |
|---|---|---|
| 4,695,740 A | 9/1987 | Carter |
| 4,713,557 A | 12/1987 | Carter |
| 4,835,418 A | 5/1989 | Hsieh |
| 4,982,115 A | 1/1991 | Lee |
| 5,079,693 A | 1/1992 | Miller |
| 5,107,148 A | 4/1992 | Millman |
| 5,107,507 A | 4/1992 | Bland et al. |
| 5,132,987 A | 7/1992 | Motohashi et al. |
| 5,173,619 A | 12/1992 | Gaudenzi et al. |
| 5,214,330 A | 5/1993 | Okazaki et al. |
| 5,214,638 A | 5/1993 | Norz et al. |
| 5,248,908 A | 9/1993 | Kimura |
| 5,295,256 A | 3/1994 | Bischoff et al. |
| 5,300,835 A | 4/1994 | Assar et al. |
| 5,381,062 A | 1/1995 | Morris |
| 5,418,933 A | 5/1995 | Kimura et al. |
| 5,428,649 A | 6/1995 | Cecchi |
| 5,428,800 A | 6/1995 | Hsieh et al. |
| 5,517,135 A | 5/1996 | Young |
| 5,627,480 A | 5/1997 | Young et al. |
| 5,644,729 A | 7/1997 | Amini et al. |

(Continued)

OTHER PUBLICATIONS

"LTC4300-A1/LTC4300A-2:Hot Swappable 2-Wire Bus Buffers," ® Linear Technology Corporation, Milpitas, California (2001).

*Primary Examiner*—Anh Q Tran
(74) *Attorney, Agent, or Firm*—Fliesler Meyer LLP

(57) ABSTRACT

A bi-directional buffer includes at least a first and second pair of one-shots and transistors. At least the first pair of one-shots and the first pair of transistors enable a second input/output (I/O) terminal to follow a first I/O terminal. At least the second pair of one-shots and the second pair of transistors enable the first I/O terminal to follow the second I/O terminal. There is a detection of whether the direction of a signal is from the first I/O terminal to second I/O terminal, or vise versa. If the direction is from the first I/O terminal to the second I/O terminal, there is an at least temporarily disabling the second pair of one-shots to thereby reduce feedback that may occur from the second I/O terminal to the first I/O terminal. If the direction is from the second I/O terminal to the first I/O terminal, there is an at least temporarily disabling the first pair of one-shots to thereby reduce feedback that may occur from the first I/O terminal to the second I/O terminal.

23 Claims, 11 Drawing Sheets

U.S. PATENT DOCUMENTS

| | | | |
|---|---|---|---|
| 5,715,405 A * | 2/1998 | McClear et al. | 710/100 |
| 5,736,870 A | 4/1998 | Greason et al. | |
| 5,808,492 A | 9/1998 | Chow | |
| 5,859,545 A | 1/1999 | Thornblad | |
| 5,917,348 A | 6/1999 | Chow | |
| 5,923,187 A * | 7/1999 | Maugars | 326/86 |
| 6,046,605 A | 4/2000 | Ziemkowski et al. | |
| 6,060,906 A | 5/2000 | Chow et al. | |
| 6,075,384 A | 6/2000 | Sim et al. | |
| 6,275,066 B1 | 8/2001 | Park et al. | |
| 6,513,090 B1 | 1/2003 | Jeddeloh | |
| 6,650,174 B2 | 11/2003 | Bell | |
| 6,822,480 B1 | 11/2004 | McCalmont | |
| 6,834,318 B2 | 12/2004 | Hunter et al. | |
| 6,842,806 B2 | 1/2005 | Ervin | |
| 6,857,040 B2 | 2/2005 | Noonan et al. | |
| 7,032,051 B2 | 4/2006 | Reay et al. | |
| 7,061,274 B2 | 6/2006 | George | |
| 7,205,793 B2 | 4/2007 | George | |
| 7,218,149 B2 | 5/2007 | Arai | |
| 7,292,067 B2 | 11/2007 | Schwarz | |
| 7,321,241 B1 | 1/2008 | Marak et al. | |
| 7,348,803 B2 | 3/2008 | Bui et al. | |
| 2005/0146358 A1 | 7/2005 | Barus et al. | |
| 2006/0038587 A1 | 2/2006 | Barus et al. | |
| 2006/0075170 A1 | 4/2006 | Behrendt et al. | |

* cited by examiner

US 7,639,045 B2

BI-DIRECTIONAL BUFFER AND METHOD FOR BI-DIRECTIONAL BUFFERING THAT REDUCE GLITCHES DUE TO FEEDBACK

PRIORITY CLAIMS

The present application claims priority under 35 U.S.C. 119(e) to the following provisional patent applications, each of which is incorporated herein by reference: U.S. Provisional Patent Application No. 61/055,774, filed May 23, 2008; and U.S. Provisional Patent Application No. 61/055,777, filed May 23, 2008.

BACKGROUND

Conventional bi-directional buffers suffer from severe signal glitches due to feedback caused by a signal circling the loop from the first input/output (I/O) terminal to the second I/O terminal and back from the second I/O terminal to the first I/O terminal, and vise versa from the second I/O terminal to the first I/O terminal and back from the first I/O terminal to the second I/O terminal. It would be beneficial to reduce, and preferably eliminate, such signal glitches that are due to feedback.

SUMMARY

In accordance with some embodiments of the present invention, bi-directional buffering is accomplished using at least a first pair of one-shots and a first pair of transistors, and a second pair of one-shots and a second pair of transistors. More specifically, at least the first pair of one-shots and the first pair of transistors (including a pull-up transistor and a pull-down transistor) are used to enable a second input/output (I/O) terminal to follow a first I/O terminal. Similarly, at least the second pair of one-shots and the second pair of transistors (including a pull-up transistor and a pull-down transistor) are used to enable the first I/O terminal to follow the second I/O terminal. There is a detection of whether the direction of a signal is from the first I/O terminal to the second I/O terminal, or vise versa from the second I/O terminal to the first I/O terminal. In response to detecting that the direction of the signal is from the first I/O terminal to the second I/O terminal, there is an at least temporary disabling of the second pair of one-shots while the direction of the signal is from the first I/O terminal to the second I/O terminal to thereby reduce feedback that may occur from the second I/O terminal to the first I/O terminal. In response to detecting that the direction of the signal is from the second I/O terminal to the first I/O terminal, there is an at least temporary disabling of the first pair of one-shots while the direction of the signal is from the second I/O terminal to the first I/O terminal to thereby reduce feedback that may occur from the first I/O terminal to the second I/O terminal.

In accordance with some embodiments of the present, bi-directional buffering is accomplished by controlling the turning on of one transistor at a time, of a first pair of transistors, to enable a second input/output (I/O) terminal to follow a first I/O terminal, as well as by controlling the turning on of one transistor at a time, of a second pair of transistors, to enable the first I/O terminal to follow the second I/O terminal. There is a detection of whether a direction of a signal is from the first I/O terminal to the second I/O terminal, or vise versa from the second I/O terminal to the first I/O terminal. In response to detecting that the direction of the signal is from the first I/O terminal to the second I/O terminal, there is an at least temporary preventing of the turning on of the second pair of transistors while the direction of the signal is from the first I/O terminal to the second I/O terminal to thereby reduce feedback that may occur from the second I/O terminal to the first I/O terminal. In response to detecting that the direction of the signal is from the second I/O terminal to the first I/O terminal, there is an at least temporary preventing of the turning on of the first pair of transistors while the direction of the signal is from the second I/O terminal to the first I/O terminal to thereby reduce feedback that may occur from the first I/O terminal to the second I/O terminal.

Further and alternative embodiments, and the features, aspects, and advantages of the embodiments of invention will become more apparent from the detailed description set forth below, the drawings and the claims.

DETAILED DESCRIPTION

Figure 1:
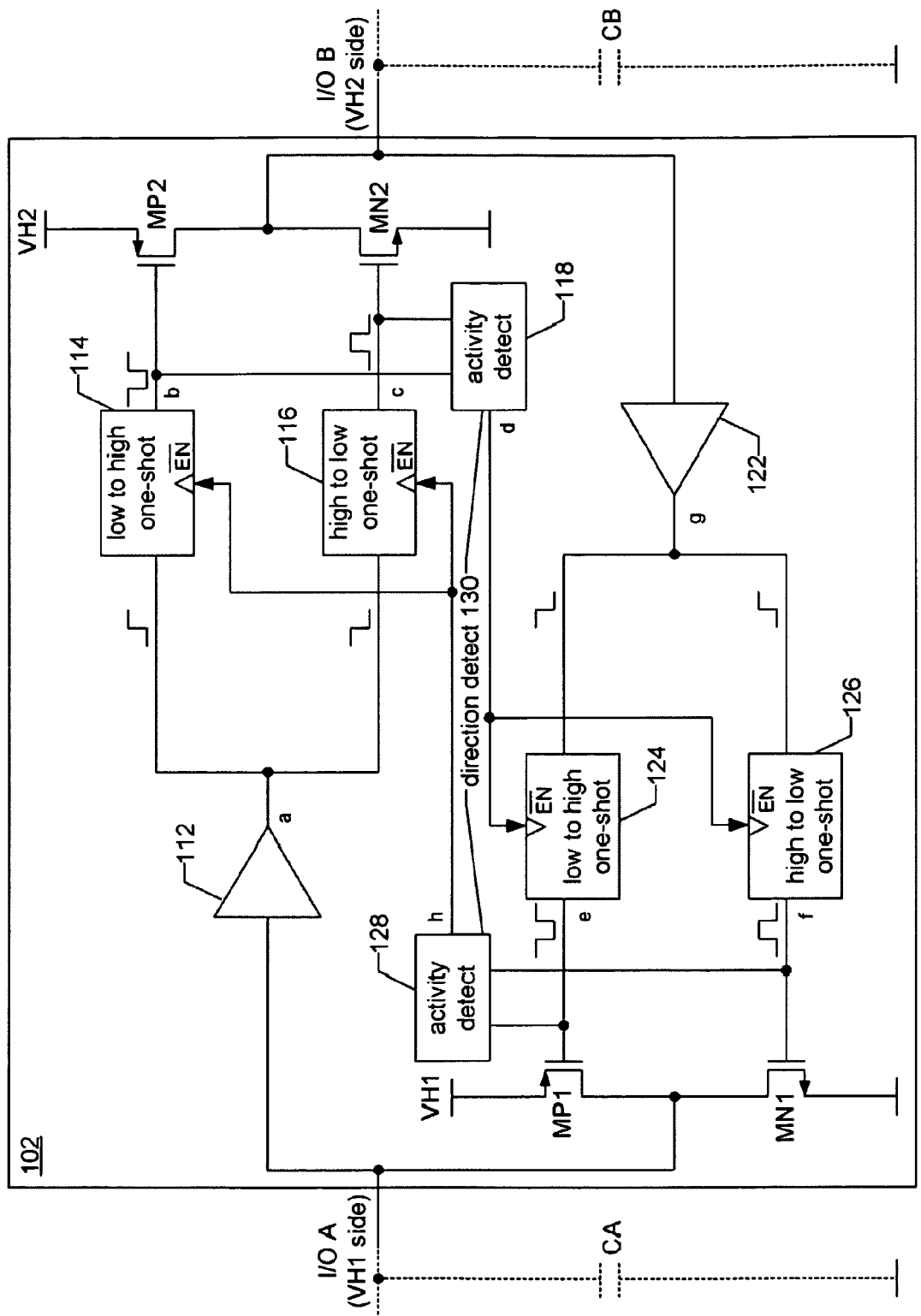
FIG. 1 illustrates a bi-directional buffer, according to an embodiment of the present invention.

A bi-directional buffer 102, according to an embodiment of the present invention, is shown in FIG. 1. The bi-directional buffer 102 is shown as being connected between a pair of input/output (I/O) nodes (which can also be referred to as I/O terminals), labeled A and B for convenience. Node A can be pulled up to a high voltage rail VH1, and node B can be pulled up to a high voltage rail VH2. The high voltage rails VH1 and VH2 can provide the same voltage level. Alternatively, VH1 can provide a different voltage level than VH2, in which case the bi-directional buffer 102 can also perform level shifting. For much of the following discussion it will be assumed that VH2 is greater than VH1, however this is not necessary (i.e., VH2 can be equal to VH1, or VH2 can be less than VH1). A capacitive load CA is shown as being between node A and a low voltage rail, and a capacitive load CB is shown as being between node B and its low voltage rail. Such capacitive loads can be parasitic capacitive loads, but are not limited thereto. The low voltage rails can be a common ground, however this is not necessary.

Referring to FIG. 1, the bi-directional buffer 102 includes PMOS transistors MP1 and MP2, NMOS transistors MN1 and MN2, buffers 112 and 122, one-shots 114, 116, 124 and 126, and activity detectors 118 and 128. The activity detectors 118 and 128 collectively provide a direction detector 130, which detects whether the direction of a signal is from I/O node A to I/O node B, or vice versa. Where level shifting is desired (i.e., where VH1 and VH2 provide different voltage levels, e.g., VH2>VH1), the buffers 112 and 122 can be level shifting buffers. Where level shifting is not desired (e.g., where VH2=VH1), the buffers 112 and 122 need not provide level shifting. An exemplary level shifting buffer is shown in and described below with reference to FIG. 5.

The output of the one-shot 114 is normally high, to keep transistor MP2 normally turned off. The one-shot 114 is enabled so long as the input to its enable terminal (EN_bar) is low, and is disabled when the input to its enable terminal (EN_bar) is high. The one-shot 114 is triggered when its input transitions from low to high. In other words, the one-shot 114 is triggered by a rising edge. In response to being triggered, the one-shot 114 produces a low going pulse having a corresponding pulse width. The low going pulse turns on transistor MP2 for a time substantially equal the pulse width of the low going pulse. When transistor MP2 is turned on node B is pulled up to the voltage of VH2.

The output of the one-shot 116 is normally low, to keep transistor MN2 normally turned off. The one-shot 116 is enabled so long as the input to its enable terminal (EN_bar) is low, and is disabled when the input to its enable terminal (EN_bar) is high. The one-shot 116 is triggered when its input transitions from high to low. In other words, the one-shot 116 is triggered by a falling edge. In response to being triggered, the one-shot 116 produces a high going pulse having a corresponding pulse width. The high going pulse turns on transistor MN2 for a time substantially equal the pulse width of the high going pulse. When transistor MN2 is turned on node B is pulled down to the voltage of the low rail voltage (e.g., ground).

The output of the one-shot 124 is normally high, to keep transistor MP1 normally turned off. The one-shot 124 is enabled so long as the input to its enable terminal (EN_bar) is low, and is disabled when the input to its enable terminal (EN_bar) is high. The one-shot 124 is triggered when its input transitions from low to high, i.e., by a rising edge. In response to being triggered, the one-shot 124 produces a low going pulse, which turns on transistor MP1 for a time substantially equal the pulse width of the low going pulse. When transistor MP1 is turned on node A is pulled up to the voltage of VH1.

The output of the one-shot 126 is normally low, to keep transistor MN1 normally turned off. The one-shot 126 is enabled so long as the input to its enable terminal (EN_bar) is low, and is disabled when the input to its enable terminal (EN_bar) is high. The one-shot 126 is triggered when its input transitions from high to low, i.e., by a falling edge. In response to being triggered, the one-shot 126 produces a high going pulse, which turns on transistor MN1 for a time substantially equal the pulse width of the high going pulse. When transistor MN1 is turned on node A is pulled down to the voltage of the low rail voltage (e.g., ground).

Figure 2:
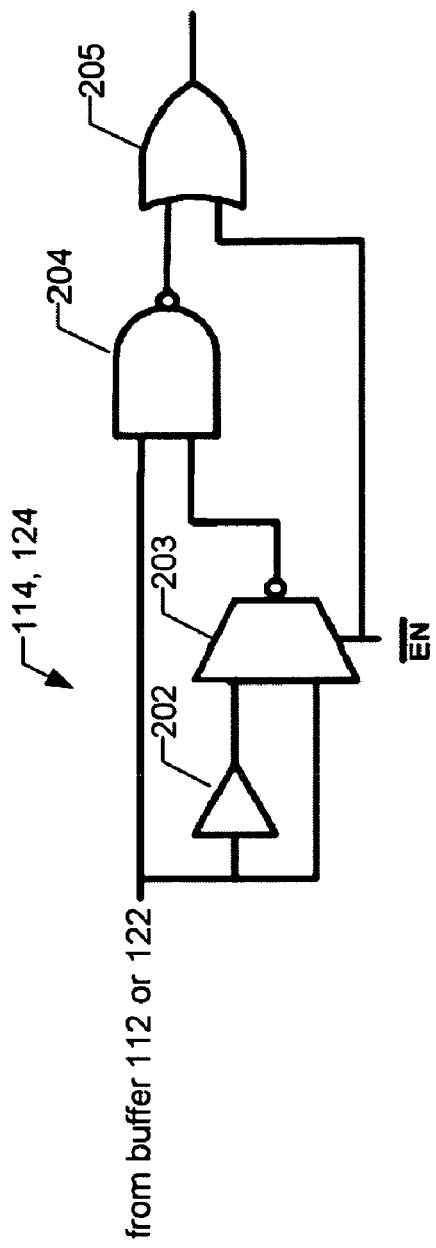
FIG. 2 illustrates an implementation for two of the one-shots of FIG. 1, according to an embodiment of the present invention.

In accordance with an embodiment, the one-shots 114 and 124 can be implemented by a buffer 202, a multiplexer 203, a NAND gate 204 and an OR gate 205, as shown in FIG. 2. The pulse width of the low going pulse produced by the one-shots 114 and 124 is specified mainly by the delay of the buffer 202.

Figure 3:
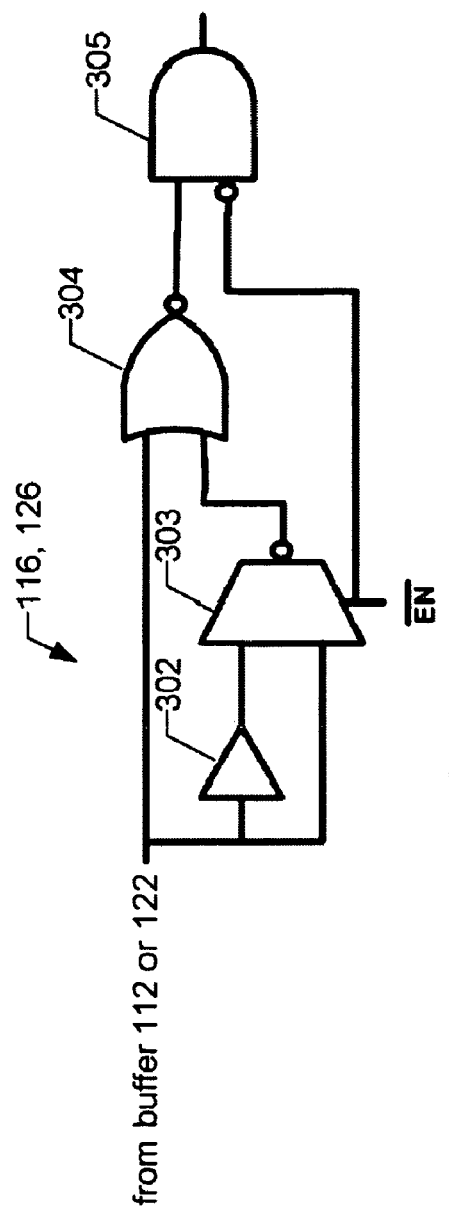
FIG. 3 illustrates an implementation for the other two of the one-shots of FIG. 1, according to an embodiment of the present invention.

In accordance with an embodiment, the one-shots 116 and 126 can be implemented by a buffer 302, a multiplexer 303, a NOR gate 304 and an AND gate 305, as shown in FIG. 3. The pulse width of the high going pulse produced by the one-shots 116 and 126 is specified mainly by the delay of the buffer 302. The delays provided by the buffers 202 and 302 can be controlled by proper design of the buffer, and/or serially connecting a number of buffers, and/or using further delay elements. Other implementations for the one-shots are possible, and within the scope of the present invention.

In accordance with an embodiment, the one-shots provide a mechanism to shorten the duration of their output pulse by providing a fast path through the multiplexer 203 (in FIG. 2) and the multiplexer 303 (in FIG. 3) for the input signal that arrives at the input of the NAND gate 204 (in FIG. 2) or the NOR gate 304 (in FIG. 3). Moreover, the output OR gate 205 in FIG. 2 and the output AND gate 305 in FIG. 3 provide a mechanism to block the one-shot pulse. In this manner, two operations can occur. First, the width of the pulse produced by the one shots can be shortened, while at the same time the pulse can be blocked from propagating through the one-shot. For example, referring to FIG. 2, when enable_bar is high, the output of the OR gate 205 is forced high, and the output of the OR gate 205 will not change state due to a state change at the output of the NAND gate 204 (so long as enable_bar remains high). Similarly, in FIG. 3, when enable_bar is high, the output of the logic gate 305 is forced low, and the output of the gate 305 will not change state due to a state change at the output of the NOR gate 304 (so long as enable_bar remains high).

The output of the activity detector 118, which is normally low, is provided to the enable_bar inputs of the one-shots 124 and 126. Thus, the one-shots 124 and 126 are normally enabled, during which they generate a one-shot pulse with a nominal duration in response to being triggered. The activity detector 118, in response to detecting a pulse produced by the one-shot 114, or a pulse produced by the one-shot 116, produces a high going pulse (also referred to as a "masking pulse"), which temporarily disables the one-shots 124 and 126 (thereby shortening the duration of any pulse being produced by the one-shots 124 or 126). When the activity detector 118 detects a pulse produced by the one-shot 114, or a pulse produced by the one-shot 116, it can be said that the direction detector 130 detects that the direction of the signal is from node A to node B. The temporary disabling of the one-shots 124 and 126 by the activity detector 118 can last for a period of time equal to a duration of a pulse produced by one of the one-shots 114 or 116. Alternatively, the activity detector 118 can disable the one-shots for a period of time that is less than or greater than a pulse produced by one of the one-shots 114 or 116, depending on implementation.

The output of the activity detector 128, which is normally low, is provided to the enable_bar inputs of the one-shots 114 and 116. Thus, the one-shots 114 and 116 are normally enabled, during which they generate a one-shot pulse with a nominal duration. in response to being triggered. The activity detector 128, in response to detecting a pulse produced by the one-shot 124, or detecting a pulse produced by the one-shot 126, produces a high going pulse (also referred to as a "masking pulse"), which temporarily disables the one-shots 114 and 116 (thereby shortening the duration of any pulse being produced by the one-shots 114 or 116). When the activity detector 128 detects a pulse produced by the one-shot 124, or a pulse produced by the one-shot 126, it can be said that the direction detector 130 detects that the direction of the signal is from node B to node A. The temporary disabling of the one-shots 114 and 116 by the activity detector 118 can last for a period of time equal to a duration of a pulse produced by one of the one-shots 124 or 126. Alternatively, the activity detector 118 can disable the one-shots for a period of time that is less than or greater than a pulse produced by one of the one-shots 124 or 126, depending on implementation.

Figure 4B:
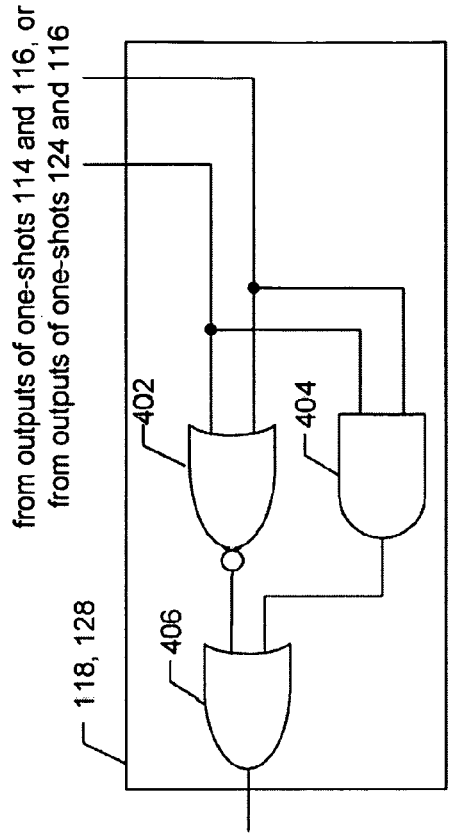
FIGS. 4A-4D illustrate various implementations for the activity detectors of FIG. 1, according to various embodiments of the present invention.
Figure 4A:
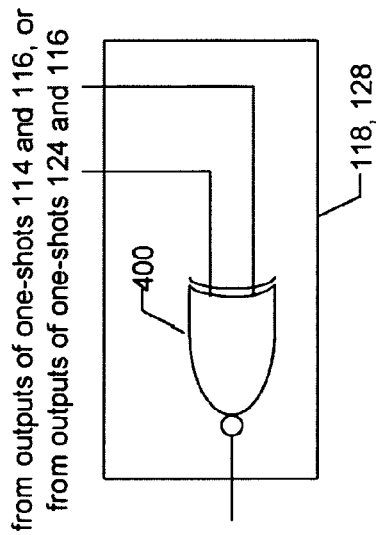
Figure 4D:
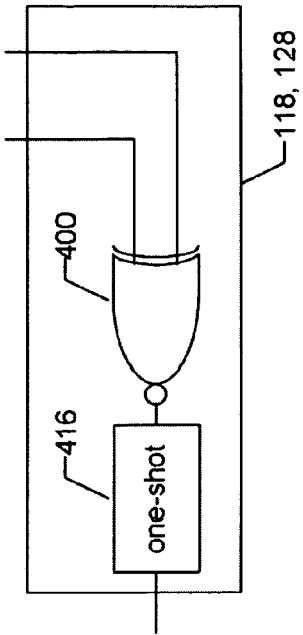
Figure 4C:
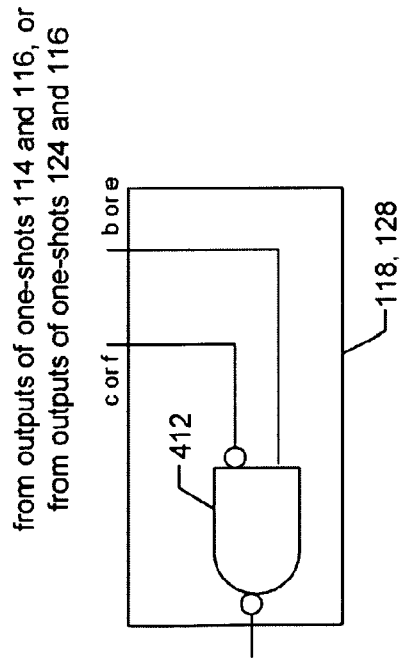

In accordance with an embodiment, each of the activity detectors 118 and 128 can be implemented by an XNOR gate 400, as shown in FIG. 4A. In accordance with another embodiment, each of the activity detectors 118 and 128 can be implemented by a NOR gate 402, an AND gate 404 and an OR gate 406, as shown in FIG. 4B. In still another embodiment, the activity detectors 118 and 128 can be implemented by a NAND gate 412, as shown in FIG. 4C. These are just a few examples, which are not meant to be limiting. Other implementations are possible, and within the scope of the present invention. For example, any logic that generates a pulse in response to low-going pulse at one input or a high-going pulse at the other input can be used to implement the activity detectors 118 and 128.

In accordance with an embodiment of the present invention, the pulse widths of the masking pulses are substantially the same as the pulse widths of the pulses produced by the one-shots 114, 116, 124 and 128. In another embodiment, a one-shot 416 can be included within the activity detectors 118 and 128, e.g., as shown in FIG. 4D, thereby providing an additional degree of freedom for specifying the pulse width of the masking pulses.

In accordance with an embodiment, a propagation delay of the activity detector 118 can be optimized with respect to forward delays of transistors MP2 and MN2 and the buffer 122, such that a time of arrival of the masking pulse (at the enable_bar inputs of one-shots 124 and 126) and a rising or falling edge at internal node g in FIG. 1 substantially match. Similarly, a propagation delay of the activity detector 128 can be optimized with respect to forward delays of transistors MP1 and MN1 and the buffer 112, such that a time of arrival of the masking pulse (at the enable_bar inputs of one-shots 114 and 116) and a rising or falling edge at internal node a in FIG. 1 substantially match.

Operation of the bi-directional buffer 102 will now be explained. Assume that nodes A and B are originally low, and then node A transitions from low to high (i.e., to VH1), causing the input to the buffer 112 to be high (i.e., VH1). The output of the buffer 112 will go high, in response to its input going high. If the buffer 112 is a level shifting buffer, the high output of the buffer 112 will differ from the high input to the buffer 112 (i.e., the high input to the buffer 112 can be VH1, and the high output of the buffer 112 can be VH2). When the output of the buffer 112 transitions from low to high, the one-shot 114 is triggered, which temporarily turns on the transistor MP2, pulling up the node B to VH2. In this manner, node B follows node A high. Additionally, the activity detector 118 will detect the pulse produced by the one-shot 114 and in response thereto the activity detector 118 will produce a masking pulse that temporarily disables the one-shots 124 and 126, thereby reducing, and preferably eliminating, feedback from being passed from node B through the buffer 122 back to node A. While feedback would be eliminated if the temporary disabling of the one-shots 124 and 126 prevents the one-shots from producing the output pulse, feedback is still reduced if the temporary disabling shortens the output pulse. The capacitance CB will maintain the node B at VH2 until a low input to node A causes node B to be pulled down, or a low input to node B causes node B to be pulled down.

Assume now that node A transitions from high (VH1) back to low, which causes the output of the buffer 112 to transition from high to low. When the output of the buffer 112 transitions from high to low, the one-shot 116 is triggered, which temporarily turns on the transistor MN2, pulling down the node B to the low rail voltage, e.g., to ground. In this manner, node B follows node A low. Additionally, the activity detector 118 will detect when the one-shot 116 produces a pulse, and in response thereto will produce a masking pulse that temporarily disables the one-shots 124 and 126, thereby reducing, and preferably eliminating, feedback from being passed from node B through the buffer 122 back to node A. While feedback would be eliminated if the temporary disabling of the one-shots 124 and 126 prevents the one-shots from producing an output pulse, feedback is still reduced if the temporary disabling shortens the output pulse. While the one-shots 124 and 126 are disabled, the transistors MP1 and MN1 are prevented from turning on.

Operation in the opposite direction occurs in a similar manner. For example, assume that nodes A and B are originally low, and then node B transitions from low to high (i.e., to VH2), causing the input to the buffer 122 to be high (i.e., VH2). The output of the buffer 122 will go high, triggering the one-shot 124 to temporarily turn on the transistor MP1, pulling up the node A to the voltage of VH1. In this manner, node A follows node B high. Additionally, the activity detector 128 will detect the pulse produced by the one-shot 124 and in response thereto the activity detector 128 will produce a masking pulse that temporarily disables the one-shots 114 and 116, thereby reducing, and preferably eliminating, feedback from being passed from node A through the buffer 112 back to node B. While the one-shots 114 and 116 are disabled, the transistors MP2 and MN2 are prevented from turning on. The capacitance CA will maintain the node A at VH1 until a low input to node B causes node A to be pulled down, or a low input to node A causes node A to be pulled down.

Assume now that node B transitions from high (VH2) back to low, which causes the output of the buffer 122 to transition from high to low. When the output of the buffer 122 transitions from high to low, the one-shot 126 is triggered, which temporarily turns on the transistor MN1 pulling down the node A to the low rail voltage, e.g., to ground. In this manner, node A follows node B low. Additionally, the activity detector 128 will detect when the one-shot 126 produces a pulse, and in response thereto will produce a masking pulse that temporarily disables the one-shots 114 and 116, thereby reducing, and preferably eliminating, feedback from being passed from node A through the buffer 112 back to node B. While feedback would be eliminated if the temporary disabling of the one-shots 114 and 116 prevents the one-shots from producing an output pulse, feedback is still reduced if the temporary disabling shortens the output pulse.

Figure 5:
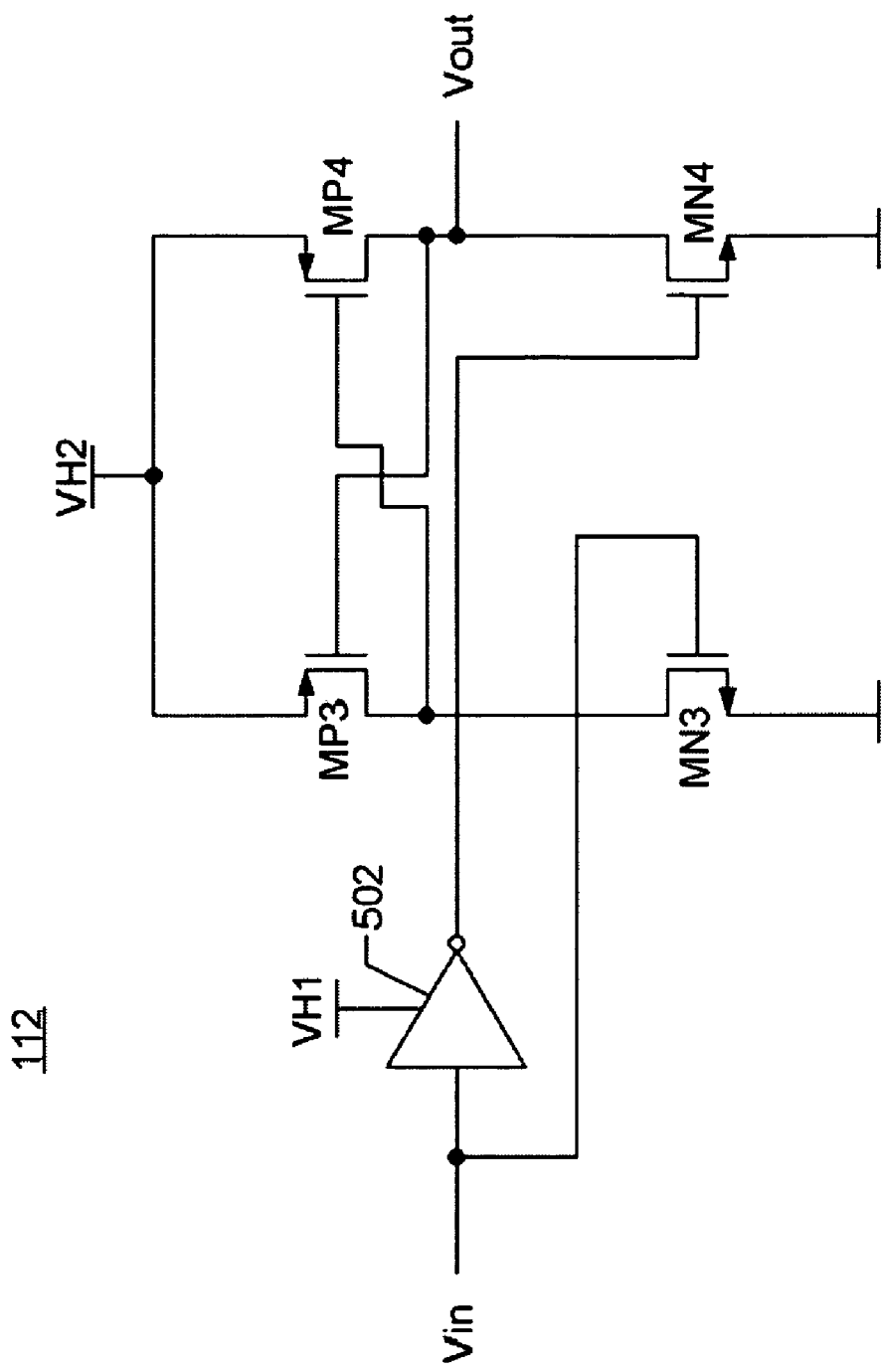
FIG. 5 illustrates an exemplary level-shifting buffer that can be used in the bi-directional buffer embodiment of FIG. 1, as well as for the bi-directional buffers of FIGS. 7A and 7B.

FIG. 5 illustrates an exemplary level-shifting buffer that can be used to implement the buffer 112 in the embodiment of FIG. 1, assuming the desire is to have the buffer 112 perform level shifting. Referring to FIG. 5, the exemplary level shifting buffer includes an inverter 502, a pair of PMOS transistors MP3 and MP4, and a pair of NMOS transistors MN3 and MN4. The inverter 502 is powered by VH1. The sources of the PMOS transistors MP3 and MP4 are connected to VH2. In the configuration shown, when Vin equals VH1, then Vout will equal VH2. A similar level shifting buffer can be used to implement buffer 122 in FIG. 1, with the only difference being that the inverter would be powered by VH2, and the sources of the PMOS transistors would be connected to VH1. FIG. 5 provides just one example of a level-shifting buffer, which is not meant to be limiting. Alternative configurations for level shifting buffers are known, can be used in place of the one shown in FIG. 5, and are within the scope of the present invention.

Figure 6:
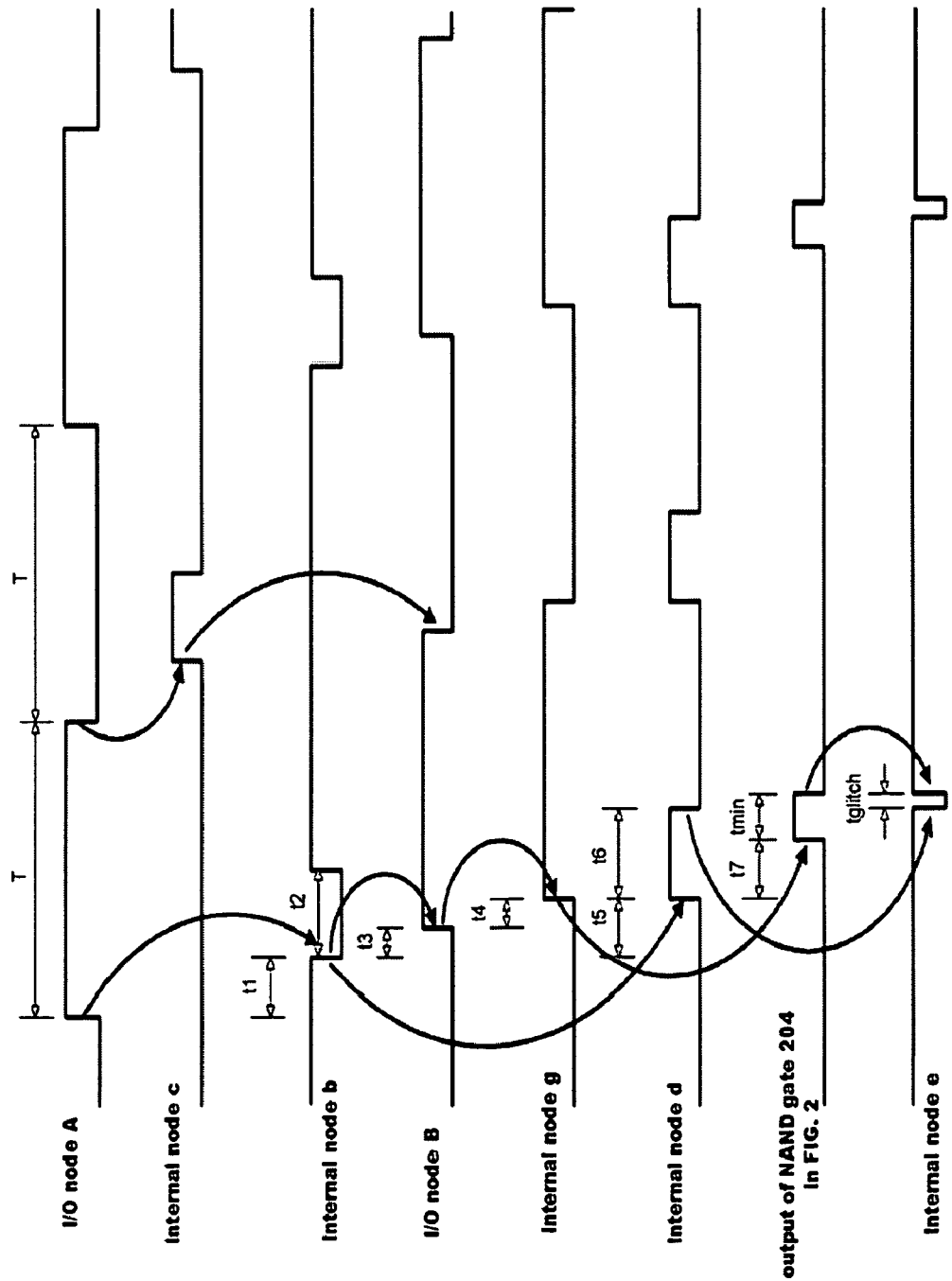
FIG. 6 is a timing diagram that helps illustrate the operation of the bi-directional buffer embodiment of FIG. 1.

FIG. 6 is an exemplary timing diagram that helps illustrate the operation of the bi-directional buffer 102 embodiment of FIG. 1, when data is being driven in the direction from the I/O node A to the I/O node B. In FIG. 1, the lower case letters at the various internal nodes of the bi-directional buffer 102 correspond to the internal nodes listed in FIG. 6. In FIG. 6, note that the signals at internal nodes e and f show that while most of the feedback from I/O node B back to I/O node A is prevented, a little feedback makes it back to I/O node A. Such small feedback is represented by the small glitch on the internal node e, which has been shown to clarify what would happen if the masking pulse provided to the one-shots (to temporarily disable the one-shots) does not completely prevent the one shots from producing an output pulse, but rather shortens the output pulse. This is just shown for illustration. Through proper design, an output pulse from the one-shots can be completely prevented.

As can be appreciated from FIG. 6, the masking operation of activity detector 118 (and 128) in conjunction with the enable_bar inputs of the one-shots 124 and 126 (and 114 and 116) depends on the relative arrival timing of the masking pulse (produced by the activity detector) and the feed back pulse from I/O node B to internal node g (and from I/O node A to internal node a), and the duration of these two pulses. Referring to the timing diagram of FIG. 6, the condition for complete masking of the feedback pulse can be expressed as $t3+t4+t7+tmin \leq t5+t6$. To achieve operation at a bit rate of $1/T$, then $t1+t2 \leq T$ should be satisfied. Considering a practical case of $t1=t5$ and $t2=t6$, the above timing constraints can be combined as $t3+t4+t7+tmin \leq T$.

FIG. 6 shows an incomplete masking of the feedback pulse for illustrative purposes. Moreover, as long as the pulse at the internal node e happens before the falling edge of the signal at I/O node A, then the existence of such a feedback pulse would not deteriorate performance. This condition can be expressed as $t1+t3+t4+t7+tmin \leq T$. The degree of feedback pulse masking depends on maximum desirable data rate and inherent speed of the process.

In summary, the bi-directional buffer 102 performs an autodetect of a driving signal (provided to node A or node B, or more generally to the first or second I/O terminal of the bi-directional buffer 102) and sends a masking pulse to the feedback path, achieving two goals. The masking pulse shortens the width of the one-shot pulse of the feedback path (and preferably eliminates the one-shot pulse of the feedback path, thereby breaking the feedback loop for that given instance and hence glitches are dramatically reduced. Additionally, since only one path is active at a given time, power consumption is reduced.

The bi-directional buffer 102 is useful in many applications, especially when connected between two capacitive loads. Further, the bi-directional buffer 102 is useful for high speed applications.

Figure 7A:
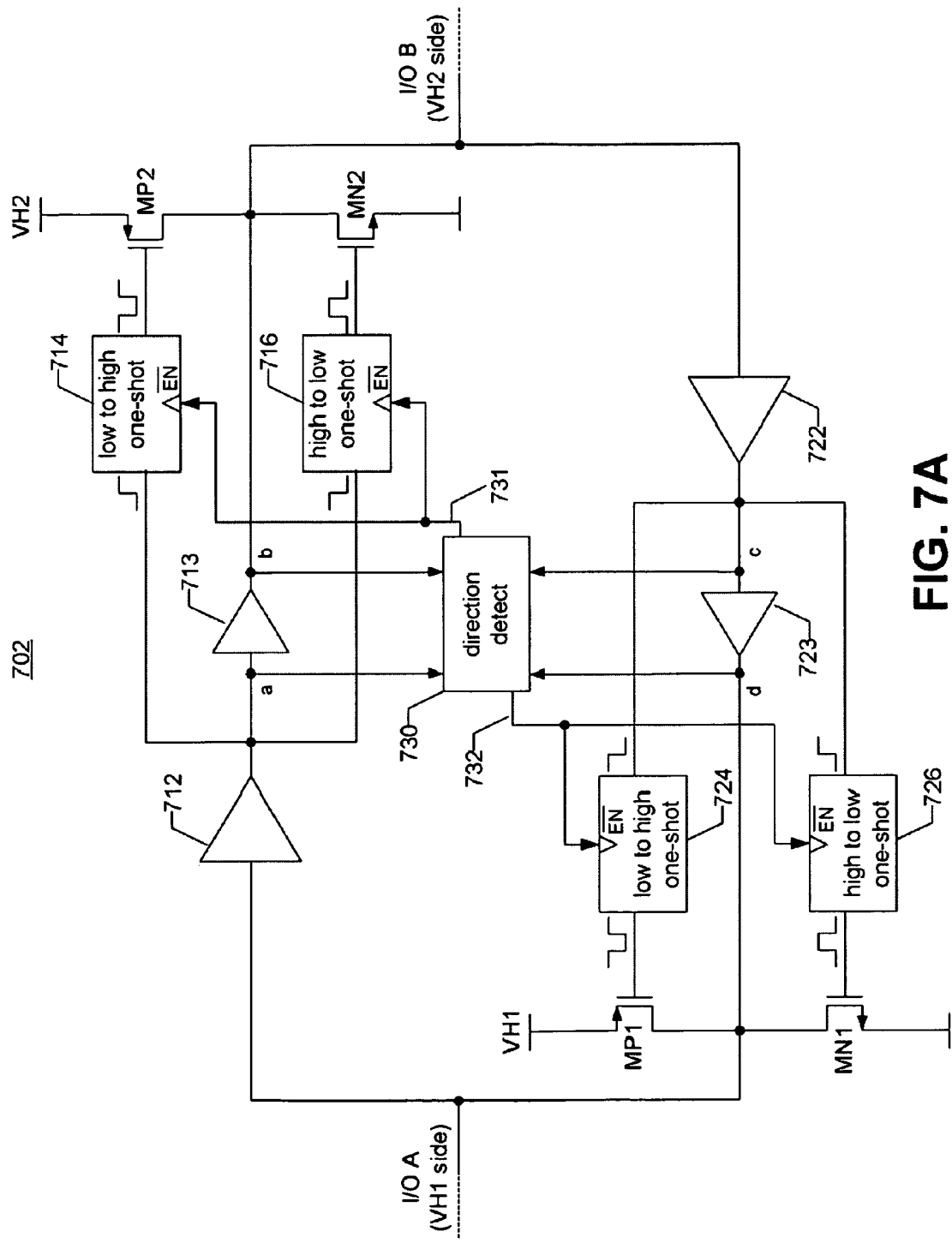
FIG. 7A illustrates a bi-directional buffer, according to another embodiment of the present invention.

A bi-directional buffer 702, according to another embodiment of the present invention, is shown in FIG. 7A. The bi-directional buffer 702 is shown as being connected between a pair of input/output (I/O) nodes (which can also be referred to as I/O terminals), labeled A and B for convenience. I/O node A can be pulled up to a high voltage rail VH1, and I/O node B can be pulled up to a high voltage rail VH2. The high voltage rails VH1 and VH2 can provide the same voltage level. Alternatively, VH1 can provide a different voltage level than VH2, in which case the bi-directional buffer 702 can also perform level shifting. For much of the following discussion it will be assumed that VH2 is greater than VH1, however this is not necessary (i.e., VH2 can equal VH1, or VH2 can be less than VH1). A capacitive and/or resistive load can be between I/O node A and a low voltage rail and/or the high voltage rail VH1, and a capacitive and/or resistive load can be between I/O node B and its low voltage rail and/or the high voltage rail VH2. Such capacitive loads can be parasitic capacitive loads, but are not limited thereto. The resistive loads, if present, would tend to pull I/O nodes A and B towards one of the voltage rails, if not for the buffers 713 and 723 (also referred to as weak buffers, or holding buffers).

Referring to FIG. 7A, the bi-directional buffer 702 includes PMOS transistors MP1 and MP2, NMOS transistors MN1 and MN2, buffers 712 and 722, buffers 713 and 723 (also referred to as weak buffers, or holding buffers), one-shots 714, 716, 724 and 726, and a direction detector 730. Where level shifting is desired (i.e., where VH1 and VH2 provide different voltage levels, e.g., VH2>VH1), the buffers 712 and 722 can be level shifting buffers. Where level shifting is not desired (e.g., where VH2=VH1), the buffers 712 and 722 need not provide level shifting. An exemplary level shifting buffer was shown in and described above with reference to FIG. 5. It is noted that where level shifting is not needed, it would be possible to remove the buffers 712 and 722. However, even if level shifting is not needed, the buffer 712 still provides useful isolation between the I/O node A and the inputs to the one-shots 714 and 716, and the buffer 722 still provides useful isolation between the I/O node B and the inputs to the one-shots 724 and 726.

The output of the one-shot 714 is normally high, to keep transistor MP2 normally turned off. The one-shot 714 is enabled when the input to its enable terminal (EN_bar) is low, and is disabled when the input to its enable terminal (EN_bar) is high. The one-shot 714 is triggered when its input transitions from low to high. In other words, the one-shot 714 is triggered by a rising edge. In response to being triggered, the one-shot 714 produces a low going pulse having a corresponding pulse width. The low going pulse turns on transistor MP2 for a time substantially equal the pulse width of the low going pulse. When transistor MP2 is turned on I/O node B is pulled up to the voltage of VH2.

The output of the one-shot 716 is normally low, to keep transistor MN2 normally turned off. The one-shot 716 is enabled when the input to its enable terminal (EN_bar) is low, and is disabled when the input to its enable terminal (EN_bar) is high. The one-shot 716 is triggered when its input transitions from high to low. In other words, the one-shot 716 is triggered by a falling edge. In response to being triggered, the one-shot 716 produces a high going pulse having a corresponding pulse width. The high going pulse turns on transistor MN2 for a time substantially equal to the pulse width of the high going pulse. When transistor MN2 is turned on I/O node B is pulled down to the voltage of the low rail voltage (e.g., ground).

The output of the one-shot 724 is normally high, to keep transistor MP1 normally turned off. The one-shot 724 is enabled when the input to its enable terminal (EN_bar) is low, and is disabled when the input to its enable terminal (EN_bar) is high. The one-shot 724 is triggered when its input transitions from low to high, i.e., by a rising edge. In response to being triggered, the one-shot 724 produces a low going pulse, which turns on transistor MP1 for a time substantially equal to the pulse width of the low going pulse. When transistor MP1 is turned on I/O node A is pulled up to the voltage of VH1.

The output of the one-shot 726 is normally low, to keep transistor MN1 normally turned off. The one-shot 726 is enabled when the input to its enable terminal (EN_bar) is low, and is disabled when the input to its enable terminal (EN_bar) is high. The one-shot 726 is triggered when its input transitions from high to low, i.e., by a falling edge. In response to being triggered, the one-shot 726 produces a high going pulse, which turns on transistor MN1 for a time substantially equal to the pulse width of the high going pulse. When transistor MN1 is turned on I/O node A is pulled down to the voltage of the low rail voltage (e.g., ground).

In accordance with an embodiment, the one-shots 714 and 724 can be implemented by a buffer 802, a NAND gate 804 and an OR gate 805, as shown in FIG. 2. The pulse width of the low going pulse produced by the one-shots 714 and 724 is specified mainly by the delay of the buffer 802. In accordance with an embodiment, the one-shots 716 and 726 can be implemented by a buffer 902, a NOR gate 904 and an AND gate 905, as shown in FIG. 3. The pulse width of the high going pulse produced by the one-shots 716 and 726 is specified mainly by the delay of the buffer 902. The delays provided by the buffers 802 and 902 can be controlled by proper design of the buffer, and/or serially connecting a number of buffers, and/or using further delay elements. Other implementations for the one-shots are possible, and within the scope of the present invention.

The holding/weak buffer 713 receives the output of the buffer 712, and provides at its output the same voltage logic level presented at its input, unless a drive signal is provided to I/O node B, in which case the output of the buffer 713 can be at a different voltage logic level than the input to the buffer 713. For example, if while the input to the buffer 713 is low, I/O node B is driven high by an external device connected to I/O node B, there would be a period of time during which the voltage at the output of the buffer 713 is high, even though the voltage at the input of the buffer 713 is low. A weak buffer can be produced by using relatively smaller transistor sizes, as compared to external transistors that will be used to drive the I/O nodes of the bi-directional buffer 702.

The holding/weak buffer 723 receives the output of the buffer 722, and provides at its output the same voltage presented at its input, unless a drive signal is provided to I/O node A, in which case the output of the buffer 723 can be at a different voltage level than the input to the buffer 723. For example, if while the input to the buffer 723 is low, I/O node A is driven high by an external device connected to I/O node A, there would be a period of time during which the voltage at the output of the buffer 723 is high, even though the voltage at the input of the buffer 723 is low.

The direction detector 730 is connected to the input side of the weak buffer 713, and also to the output side of the weak buffer 713, with the output side of the weak buffer 713 also connected to I/O node B. The direction detector 730 is similarly connected to the input side of the weak buffer 723, and also to the output side of the weak buffer 723, with the output side of the weak buffer 723 also connected to I/O node A.

When the voltage logic level at the input to the buffer 713 is different than the voltage logic level at the output of the buffer 713, this is indicative of initial driving of a signal (e.g., a data signal) from I/O node B to I/O node A. When the voltage logic level at the input to the buffer 723 is different than the voltage logic level at the output of the buffer 723, this is indicative of initial driving of a signal (e.g., a data signal) from I/O node A to I/O node B. By monitoring such voltage logic levels, the direction detector 730 can detect whether a drive signal is from I/O node A to I/O node B, or from I/O node B to I/O node A.

Figure 10:
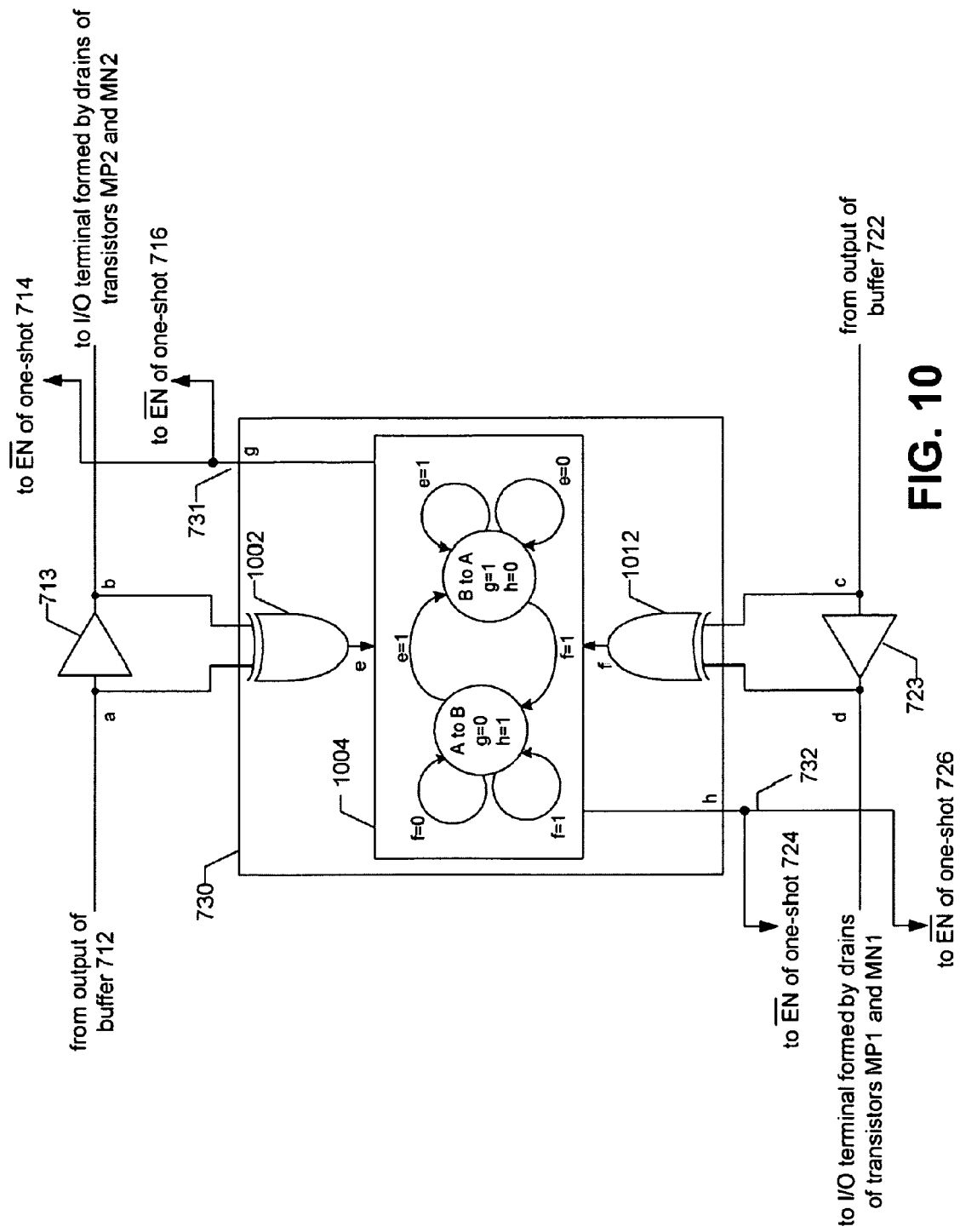
FIG. 10 illustrates an implementation for the direction detector of the bi-directional buffer of FIG. 7A, according to an embodiment of the present invention.

In FIG. 7A, the lower case letters at the various internal nodes of the bi-directional buffer 702 correspond to the internal nodes also shown in FIG. 10.

In the embodiment shown in FIG. 7A, the direction detector 730 has a first output 731 and a second output 732. In accordance with an embodiment, when the direction of data flow is from I/O node A to I/O node B, the output 731 is low (which enables the one shots 714 and 716), and the output 732 is high (which disable the one-shots 724 and 726). It is also possible to reverse the polarity of the outputs 731 and 732, if the one-shots were enabled by a high input to their enable terminals. Alternatively, the direction detector 730 can produce a single output 731, in which case the one-shots 724' and 726' would be enabled in an opposite manner than one-shots 714 and 716, as shown in the bi-directional buffer 702' of FIG. 7B. Again, polarity of the single output 731 can be reversed, so long as the enabling of the one-shots was also appropriately reversed. Other configurations are also possible.

In accordance with an embodiment of the present invention, described with reference to FIG. 10, the direction detector 730 can include XOR circuitry 1002, XOR circuitry 1012, and enable circuitry 1004 that selectively enables and disables the one-shots 714, 716, 724 and 726. The enable circuitry 1004 can be implemented, e.g., by a state machine that performs the functions of the state diagram shown within the block 1004 in FIG. 10. Alternative circuitry can be used to implement the enable circuitry 1004. Also, alternative exclusive distinction detection circuitry can be used in place of the XORs 1002 and 1012, as would be apparent to one of ordinary skill in the art.

The XOR 1002 (or another exclusive distinction detector) compares the voltage logic level at the input of the weak buffer 713 (which is the voltage at the output of the buffer 712) to the voltage logic level at the output of the weak buffer 713 (which is the voltage at I/O node B). So long as the voltage logic levels being compared by XOR 1002 are the same (i.e., both voltage logic levels are low, or both are high), the output of the XOR 1002 is low. When the voltage logic levels being compared by the XOR 1002 are different (i.e., one voltage logic level is low, while the other is high), the output of the XOR 1002 goes high. In this manner, when a signal driving the bi-directional buffer 702 is in the direction from I/O node A to I/O node B, the output of the XOR 1002 is low. However, when a signal driving the bi-directional buffer reverses, i.e., is in the direction from I/O node B to I/O node A, the output of the XOR 1002 goes high.

The XOR 1012 (or another exclusive distinction detector) compares the voltage logic level at the input of the weak buffer 723 (which is the voltage at the output of the buffer 722) to the voltage logic level at the output of the weak buffer 723 (which is the voltage at I/O node A). So long as the voltage logic levels being compared by the XOR 1012 are the same (i.e., both voltage logic levels are low, or both are high), the output of the XOR 1012 is low. When the voltage logic levels being compared by the XOR 1012 are different (i.e., one voltage logic level is low, while the other is high), the output of the XOR 1012 goes high. In this manner, when a signal driving the bi-directional buffer is in the direction from I/O node B to I/O node A, the output of the XOR 1012 is low. However, when the when a signal driving the bi-directional buffer reverses, i.e., is in the direction from I/O node A to I/O node B, the output of the XOR 1012 goes high.

To summarize operation of the XORs 1002 and 1012, when a drive signal is in the direction from I/O node A to I/O node B, the output of the XOR 1002 will be low, and the output of the XOR 1012 will be high. When the output of the XOR 1002 is low, and the output of the XOR 1012 is high, the signal 731 will be low (which will enable the one-shots 714 and 716), and the signal 732 will be high (which will disable the one-shots 724 and 726). By disabling the one-shots 724 and 726, I/O node A should not be affected by feedback from I/O node B.

When the direction of the drive signal is in reverse, i.e., in the direction from I/O node B to I/O node A, the output of the XOR 1012 will be low, and the output of the XOR 1002 will be high. When the output of the XOR 1012 is low, and the output of the XOR 1002 is high, the signal 732 will be low (which will enable the one-shots 724 and 726), and the signal 731 will be high (which will disable the one-shots 714 and 716). By disabling the one-shots 714 and 716, I/O node B should not be affected by feedback from I/O node A.

Operation of the bi-directional buffer 702 will now be explained. Referring to FIG. 7A, assume that I/O nodes A and B are originally low, and then I/O node A transitions from low to high (i.e., to VH1). This can occur due to an external device connected to I/O node A driving I/O node A high. This will cause the input to the buffer 712 to be high (i.e., VH1), which will cause the output of the buffer 712 to go high. If the buffer 712 is a level shifting buffer, the high output of the buffer 712 will differ from the high input to the buffer 712 (i.e., the high input to the buffer 712 can be VH1, and the high output of the buffer 712 can be VH2). When the output of the buffer 712 transitions from low to high, the one-shot 714 is triggered (so long as the one-shot 714 is enabled, which it is as explained below), which temporarily turns on the transistor MP2, pulling up I/O node B to the voltage of VH2.

During the above, the input and output of the weak buffer 713 will both transition from low to high and thus remain the same (except for the delay through the buffer 713, which is handled by glitch suppression logic within the direction detector 730). However, the input and output of the weak buffer 723 will differ for a period of time sufficient for the direction detector 730 to detect that the drive signal is from I/O node A to I/O node B, enabling the one-shots 714 and 716, and disabling the one-shots 724 and 726 (during which transistors MP1 and MN1 are kept off). In other words, when the one-shots 724 and 726 are disabled, the transistors MP1 and MN1 are prevented from turning on.

Assume now that I/O node A transitions from high (VH1) back to low, which causes the output of the buffer 712 to transition from high to low. When the output of the buffer 712 transitions from high to low, the one-shot 716 is triggered (so long as the one-shot 716 is enabled, which it is as explained below), which temporarily turns on the transistor MN1, pulling down I/O node B (e.g., to ground). During the above, the input and output of the weak buffer 713 will both transition from high to low and thus remain the same (except for the delay through the buffer 713, which is handled by glitch suppression logic within the direction detector 730). However, the input and output of the weak buffer 723 will differ for a period of time sufficient for the direction detector 730 to again detect that the drive signal is from I/O node A to I/O node B, causing the continued enabling of the one-shots 714 and 716, and the continued disabling of the one-shots 724 and 726 (during which transistors MP1 and MN1 are kept off).

Operation in the opposite direction occurs in a similar manner. Assume now the direction of the drive signal reverses, and that a device driving I/O node B causes I/O node B to transition from low to high (VH2), causing the input to the buffer 722 to be high (i.e., VH2). The output of the buffer 722 will go high, in response to its input going high. If the buffer 722 is a level shifting buffer, the high output of the buffer will differ from the high input to the buffer 722 (i.e., the high input to the buffer 722 can be VH2, and the high output of the buffer 722 can be VH1). When the output of the buffer 722 transitions from low to high, the one-shot 724 is triggered (so long as the one-shot 724 is enabled, which it is as explained below), which temporarily turns on the transistor MP1, pulling up the I/O node A to the voltage of VH1. During the above, the input and output of the weak buffer 723 will both transition from low to high and thus remain the same (except for the delay through the buffer 723, which is handled by glitch suppression logic within the direction detector 730). However, the input and output of the weak buffer 713 will differ for a period of time sufficient for the direction detector 730 to detect that the drive signal is from I/O node B to I/O node A, enabling the one-shots 724 and 726, and disabling the one-shots 714 and 716 (during which transistors MP2 and MN2 are kept off). In other words, when the one-shots 714 and 716 are disabled, the transistors MP2 and MN2 are prevented from turning on.

Assume now that I/O node B transitions from high (VH2) back to low, which causes the output of the buffer 722 to transition from high to low. When the output of the buffer 722 transitions from high to low, the one-shot 726 is triggered (so long as the one-shot 726 is enabled, which it is as explained below), which temporarily turns on the transistor MN1, pulling down the I/O node A (e.g., to ground). During the above, the input and output of the weak buffer 723 will both transition from high to low and thus remain the same (except for the delay through the buffer 723, which is handled by glitch suppression logic within the direction detector 730). However, the input and output of the weak buffer 713 will differ for a period of time sufficient for the direction detector 730 to again detect that the drive signal is from I/O node B to I/O node A, causing the continued enabling of the one-shots 724 and 726, and the continued disabling of the one-shots 714 and 716 (during which transistors MP2 and MN2 are kept off).

Figure 7B:
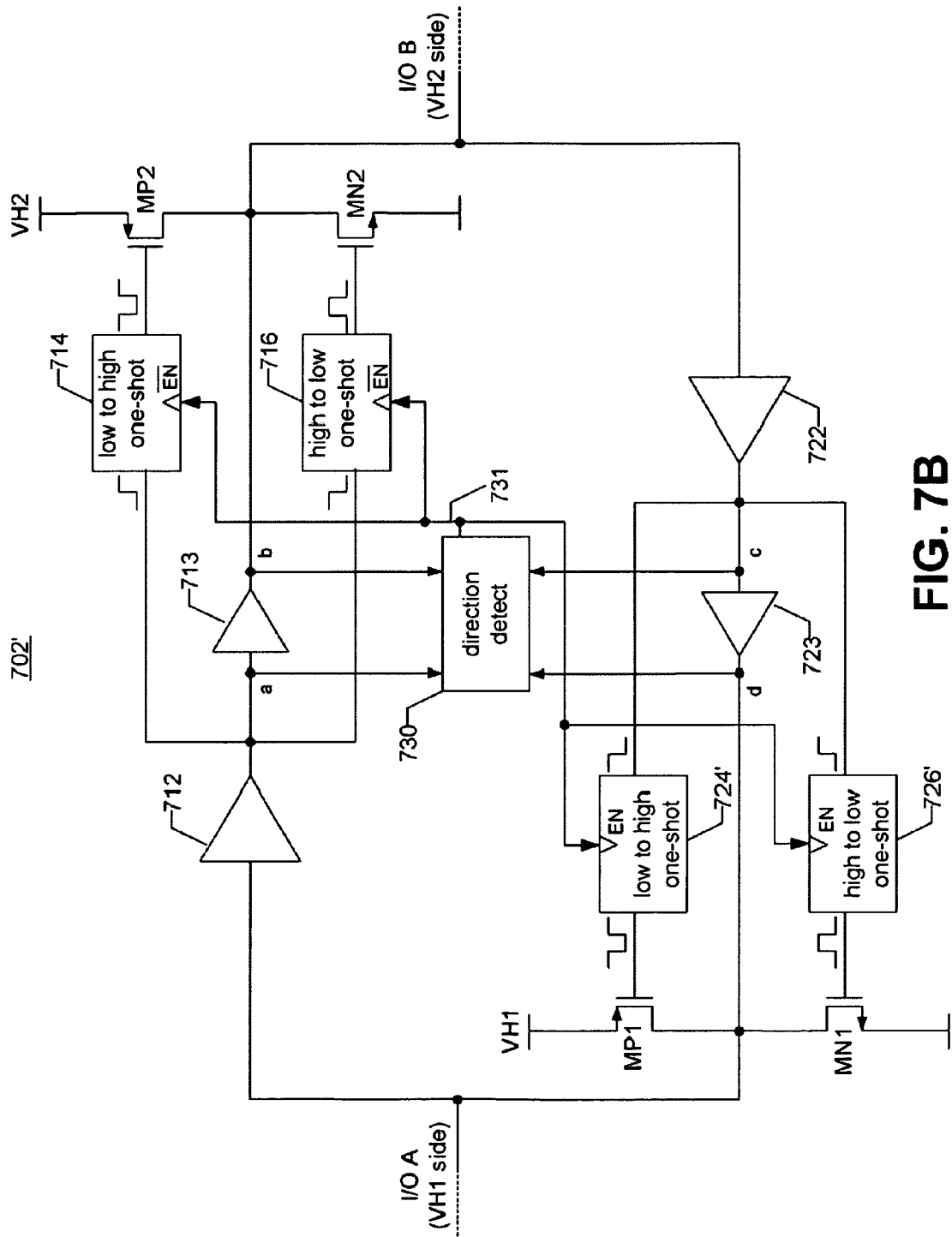
FIG. 7B illustrates a bi-directional buffer, according to still another embodiment of the present invention.
Figure 8:
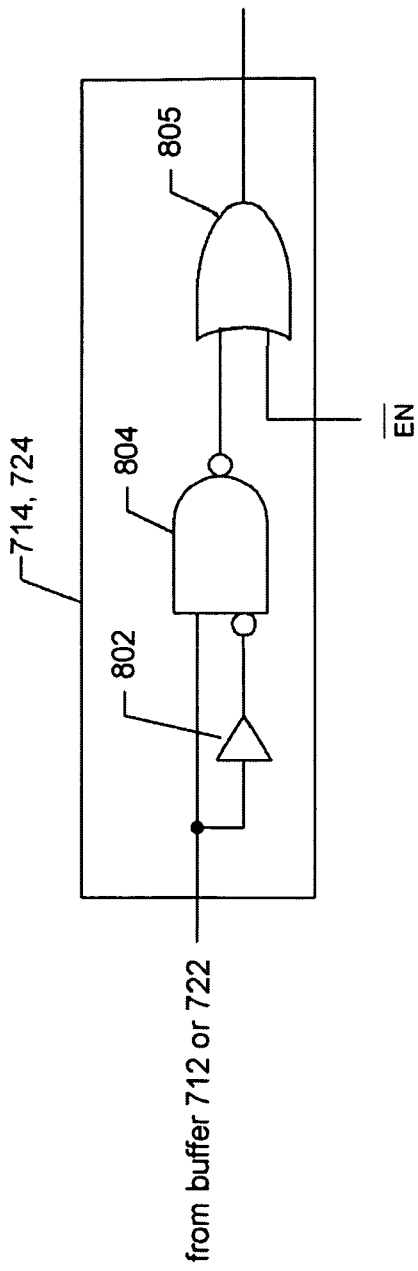
FIG. 8 illustrates an implementation for two of the one-shots of the bi-directional buffers of FIGS. 7A and 7B, according to an embodiment of the present invention.
Figure 9:
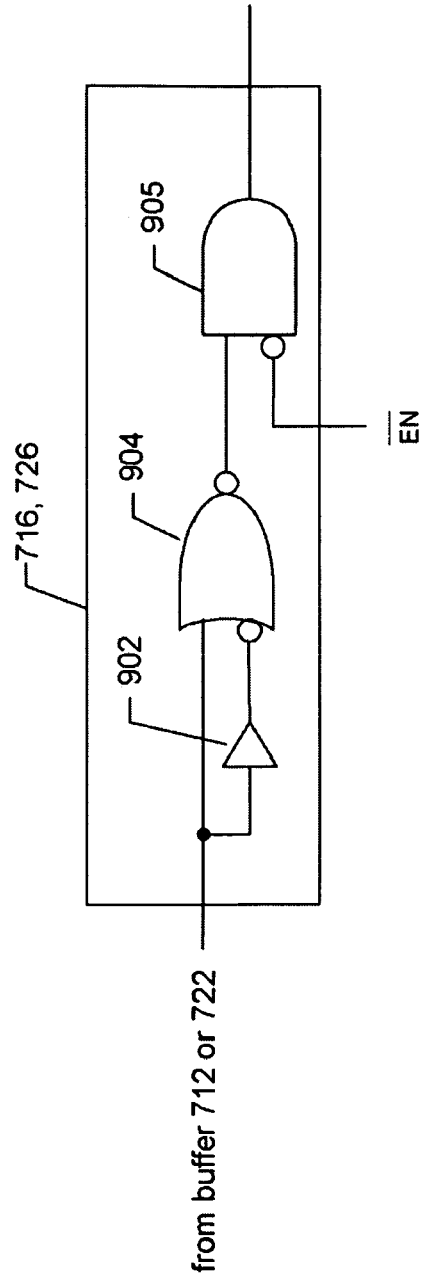
FIG. 9 illustrates an implementation for the other two of the one-shots of the bi-directional buffers of FIGS. 7A and 7B, according to an embodiment of the present invention.

FIG. 5, discussed above, illustrates an exemplary level-shifting buffer that can be used to implement the buffer 712 in the embodiments of FIGS. 7A and 7B, assuming the desire is to have the buffer 712 perform level shifting. Alternative configurations for level shifting buffers are known, can be used in place of the one shown in FIG. 5, and are within the scope of the present invention.

In summary, the bi-directional buffer 702 (and 702') detects the direction of a drive signal (provided to I/O node A or I/O node B, or more generally to the first or second I/O terminal of the bi-directional buffer) and selectively enables a forward signal path while disabling the feedback signal path. Additionally, since only one path is active at a given time, power consumption is reduced.

The bi-directional buffers 702 and 702' of embodiments of the present invention are useful in many applications, and can be connected between capacitive and/or resistive loads. Further, the bi-directional buffers 702 and 702' of embodiments of the present invention are useful for high speed applications.

Figure 11:
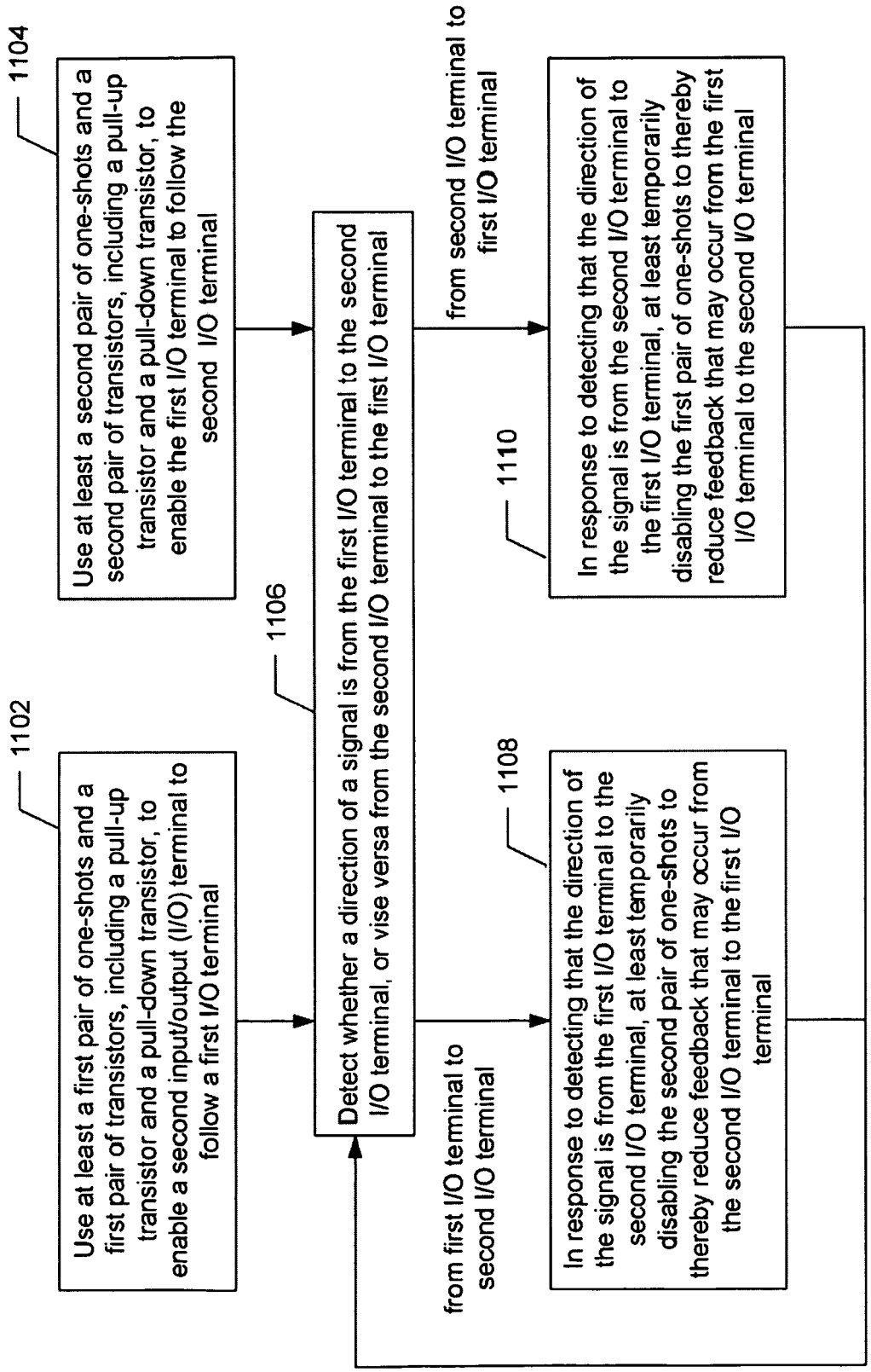
FIGS. 11 and 12 are high level flow diagrams that are used to summarize various embodiments of the present invention.
Figure 12:
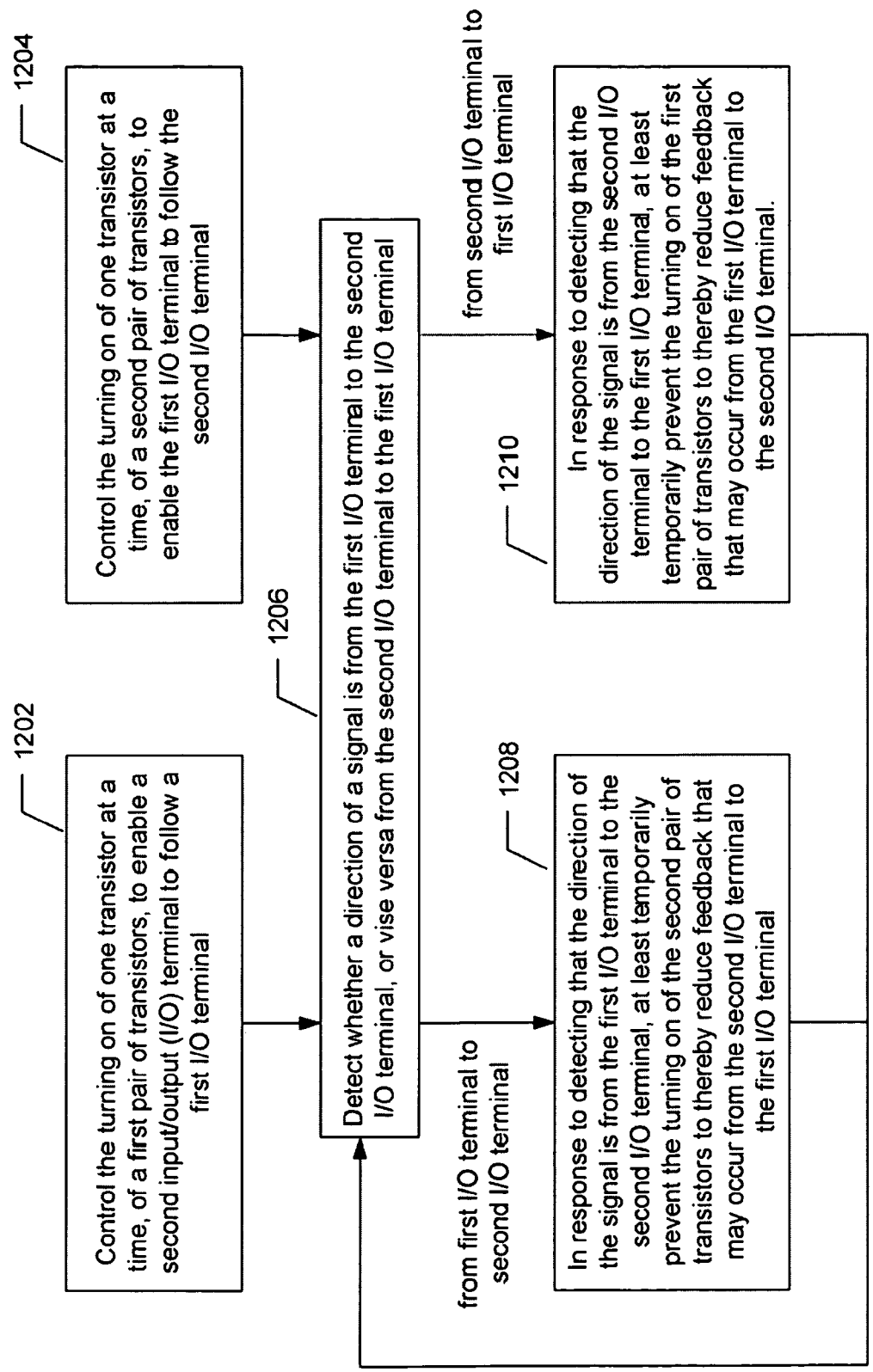

FIGS. 11 and 12 are high level flows diagram that are used to summarize various embodiments of the present invention for bi-directional buffering. Referring first to FIG. 11, as indicated at 1102 and 1104, a first pair of one-shots and a first pair of transistors (including a pull-up transistor and a pull-down transistor) are used to enable a second input/output (I/O) terminal to follow a first I/O terminal, and a second pair of one-shots and a second pair of transistors (including a pull-up transistor and a pull-down transistor) are used to enable the first I/O terminal to follow the second I/O terminal. One of steps 1102 and 1104 occur at a time, depending on a direction of a signal. As indicated at block 1106, there is a detection of whether a direction of a signal is from the first I/O terminal to the second I/O terminal, or vise versa from the second I/O terminal to the first I/O terminal. As indicated at 1108, in response to detecting that the direction of the signal is from the first I/O terminal to the second I/O terminal, there is an at least temporary disabling of the second pair of one-shots to thereby reduce feedback that may occur from the second I/O terminal to the first I/O terminal. As indicated at 1110, in response to detecting that the direction of the signal is from the second I/O terminal to the first I/O terminal, there is an at least temporary disabling of the first pair of one-shots to thereby reduce feedback that may occur from the first I/O terminal to the second I/O terminal. One of steps 1108 and 1110 occur at a time, depending on the direction of the signal.

Referring to FIG. 11 and back to FIG. 1, the function of 1106 can be accomplished by monitoring for activity at outputs of the first pair of one-shots (e.g., 114 and 116) and at outputs of the second pair of one-shots (e.g., 124 and 126). This can include detecting that the direction of the signal is from the first I/O terminal (e.g., A) to the second I/O terminal (e.g., B) in response to detecting activity at either one of the outputs of the first pair of one-shots (e.g., 114 and 116), and detecting that the direction of the signal is from the second I/O terminal (e.g., B) to the first I/O terminal (e.g., A) in response to detecting activity at either one of the outputs of the second pair of one-shots (e.g., 124 and 126). Still referring to FIG. 11 and back to FIG. 1, the function of 1108 can be accomplished by disabling the second pair of one-shots (e.g., 124 and 126) while activity is detected at either one of the outputs of the first pair of one-shots (e.g., 114 and 116), and the function of 1110 can be accomplished by disabling the first pair of one-shots (e.g., 114 and 116) while activity is detected at either one of the outputs of the second pair of one-shots (e.g., 124 and 126).

Referring to FIG. 11 and back to FIGS. 7A and 7B, the function of 1106 can alternatively be accomplished by comparing voltage logic levels at an input and an output of a first buffer (e.g., 713) that is within a first signal path from the first I/O terminal (e.g., A) to the second I/O terminal (e.g., B), and comparing voltage logic levels at an input and an output of a second buffer (e.g., 723) that is within a second signal path from the second I/O terminal (e.g., B) to the first I/O terminal (e.g., A). The direction of the signal can be detected to be from the first I/O terminal (e.g., A) to the second I/O terminal (e.g., B) in response to detecting that the voltage logic level at the output of the second buffer (e.g., 723) is different than the voltage logic level at the input of the second buffer, the direction of the signal can be detected to be from the second I/O terminal (e.g., B) to the first I/O terminal (e.g., A) in response to detecting that the voltage logic level at the output of the first buffer (e.g., 713) is different than the voltage logic level at the input of the first buffer. Still referring to FIG. 11, and back to FIGS. 7A and 7B, the function of 1108 can be accomplished by disabling the second pair of one-shots (e.g., 724 and 726) so long as the direction of the signal is from the first I/O terminal (e.g., A) to the second I/O terminal (e.g., B), and the function of 1110 can be accomplished by disabling the first pair of one-shots (e.g., 714 and 716) so long as the direction of the signal is from the second I/O terminal (e.g., B) to the first I/O terminal (e.g., A).

Referring now to FIGS. 12, 1202 and 1204 include controlling the turning on of one transistor at a time, of a first pair of transistors (e.g., MP2 and MN2), to enable a second input/output (I/O) terminal (e.g., A) to follow a first I/O terminal (e.g., B), and controlling the turning on of one transistor at a time, of a second pair of transistors (e.g., MP1 and MN1), to enable the first I/O terminal (e.g., A) to follow the second I/O terminal (e.g., B). One of steps 1202 and 1204 occurs at a time, depending on a direction of a signal. As indicated at 1206, there is a detection of whether a direction of a signal is from the first I/O terminal (e.g., A) to the second I/O terminal (e.g., B), or vise versa from the second I/O terminal (e.g., B) to the first I/O terminal (e.g., A). Exemplary techniques for detecting the direction of the signal were discussed above, e.g., with reference to 1106. As indicated at 1208, in response to detecting that the direction of the signal is from the first I/O terminal (e.g., A) to the second I/O terminal (e.g., B), there is at least temporary preventing of the turning on of the second pair of transistors (e.g., MP1 and MN1) to thereby reduce feedback that may occur from the second I/O terminal (e.g., B) to the first I/O terminal (e.g., A). As indicated at 1210, in response to detecting that the direction of the signal is from the second I/O terminal (e.g., B) to the first I/O terminal (e.g., A), there is at least temporary preventing of the turning on of the first pair of transistors (e.g., MP2 and MN2) to thereby reduce feedback that may occur from the first I/O terminal (e.g., A) to the second I/O terminal (e.g., B). One of steps 1208 and 1210 occurs at a time, depending on the direction of the signal.

In the above described embodiments, PMOS transistors MP1 and MP2 function as pull-up transistors, and NMOS transistors MN1 and MN2 function as pull-down transistors. In alternative embodiments, PNP bi-polar junction transistors can be used in place of MP1 and MP2, and NPN bi-polar junction transistors can be used in place of MN1 and MN2. In such alternative embodiments, the PNP transistors function as pull-up transistors, and the NPN transistors function as pull-down transistors.

Embodiments of the present invention have been described above with the aid of functional building blocks illustrating the performance of specified functions and relationships thereof. The boundaries of these functional building blocks have often been arbitrarily defined herein for the convenience of the description. Alternate boundaries can be defined so long as the specified functions and relationships thereof are appropriately performed. Any such alternate boundaries are thus within the scope and spirit of the invention.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. For example, certain elements were described as being enabled in response to low inputs, and disabled in response to high inputs. Such elements can be modified such that they are enabled in response to high inputs, and disabled in response to low inputs, so long as other elements that enable and disable such elements are correspondingly modified. This is just one exemplary modification. Many other modifications are also possible, and within the scope of the present invention.

Embodiments were chosen and described in order to best describe the principles of the invention and its practical application, thereby enabling others skilled in the art to understand the invention. It is intended that the scope of the invention be defined by the following claims and their equivalents.

What is claimed:

1. A method for bi-directional buffering, comprising:
    (a) using at least a first pair of one-shots and a first pair of transistors, including a pull-up transistor and a pull-down transistor, to enable a second input/output (I/O) terminal to follow a first I/O terminal;
    (b) using at least a second pair of one-shots and a second pair of transistors, including a pull-up transistor and a pull-down transistor, to enable the first I/O terminal to follow the second I/O terminal;
    (c) detecting whether a direction of a signal is from the first I/O terminal to the second I/O terminal, or vise versa from the second I/O terminal to the first I/O terminal;
    (d) in response to detecting that the direction of the signal is from the first I/O terminal to the second I/O terminal, at least temporarily disabling the second pair of one-shots while the direction of the signal is from the first I/O terminal to the second I/O terminal to thereby reduce feedback that may occur from the second I/O terminal to the first I/O terminal; and
(e) in response to detecting that the direction of the signal is from the second I/O terminal to the first I/O terminal, at least temporarily disabling the first pair of one-shots while the direction of the signal is from the second I/O terminal to the first I/O terminal to thereby reduce feedback that may occur from the first I/O terminal to the second I/O terminal.

2. The method of claim 1, wherein step (c) comprises:
monitoring for activity at outputs of the first pair of one-shots and at outputs of the second pair of one-shots; and
detecting that the direction of the signal is from the first I/O terminal to the second I/O terminal in response to detecting activity at either one of the outputs of the first pair of one-shots; and
detecting that the direction of the signal is from the second I/O terminal to the first I/O terminal in response to detecting activity at either one of the outputs of the second pair of one-shots.

3. The method of claim 2, wherein:
step (d) comprises disabling the second pair of one-shots while activity is detected at either one of the outputs of the first pair of one-shots; and
step (e) comprises disabling the first pair of one-shots while activity is detected at either one of the outputs of the second pair of one-shots.

4. The method of claim 1, wherein step (c) comprises:
comparing voltage logic levels at an input and an output of a first buffer that is within a first signal path from the first I/O terminal to the second I/O terminal;
comparing voltage logic levels at an input and an output of a second buffer that is within a second signal path from the second I/O terminal to the first I/O terminal;
detecting that the direction of the signal is from the first I/O terminal to the second I/O terminal in response to detecting that the voltage logic level at the output of the second buffer is different than the voltage logic level at the input of the second buffer; and
detecting that the direction of the signal is from the second I/O terminal to the first I/O terminal in response to detecting that the voltage logic level at the output of the first buffer is different than the voltage logic level at the input of the first buffer.

5. The method of claim 4, wherein:
step (d) comprises disabling the second pair of one-shots so long as the direction of the signal is from the first I/O terminal to the second I/O terminal; and
step (e) comprises disabling the first pair of one-shots so long as the direction of the signal is from the second I/O terminal to the first I/O terminal.

6. The method of claim 1, wherein step (a) comprises:
in response to a low to high transition at the first I/O terminal, triggering one of the one-shots, of the first pair of one-shots, to thereby temporarily turn on the pull-up transistor of the first pair of transistors, to thereby pull-up the second I/O terminal;
in response to a high to low transition at the first I/O terminal, triggering the other one of the one-shots, of the first pair of one-shots, to thereby temporarily turn on the pull-down transistor of the first pair of transistors, to thereby pull-down the second I/O terminal;
in response to a low to high transition at the second I/O terminal, triggering one of the one-shots, of the second pair of one-shots, to thereby temporarily turn on the pull-up transistor of the second pair of transistors, to thereby pull-up the first I/O terminal; and
in response to a high to low transition at the second I/O terminal, triggering the other one of the one-shots, of the second pair of one-shots, to thereby temporarily turn on the pull-down transistor of the second pair of transistors, to thereby pull-down the first I/O terminal;
wherein the first pair of one-shots will not turn on the either of the first pair of transistors, when the first pair of one-shots are disabled; and
wherein the second pair of one-shots will not turn on the either of the second pair of transistors, when the second pair of one-shots are disabled.

7. A method for bi-directional buffering, comprising:
(a) controlling the turning on of one transistor at a time, of a first pair of transistors, to enable a second input/output (I/O) terminal to follow a first I/O terminal;
(b) controlling the turning on of one transistor at a time, of a second pair of transistors, to enable the first I/O terminal to follow the second I/O terminal;
(c) detecting whether a direction of a signal is from the first I/O terminal to the second I/O terminal, or vise versa from the second I/O terminal to the first I/O terminal;
(d) in response to detecting that the direction of the signal is from the first I/O terminal to the second I/O terminal, at least temporarily preventing the turning on of the second pair of transistors by at least temporarily disabling at least one one-shot while the direction of the signal is from the first I/O terminal to the second I/O terminal to thereby reduce feedback that may occur from the second I/O terminal to the first I/O terminal; and
(e) in response to detecting that the direction of the signal is from the second I/O terminal to the first I/O terminal, at least temporarily preventing the turning on of the first pair of transistors by at least temporarily disabling at least one further one-shot while the direction of the signal is from the second I/O terminal to the first I/O terminal to thereby reduce feedback that may occur from the first I/O terminal to the second I/O terminal.

8. The method of claim 7, wherein:
step (d) comprises preventing the turning on of the second pair of transistors so long as the direction of the signal is from the first I/O terminal to the second I/O terminal; and
step (e) comprises preventing the turning on of the first pair of transistors so long as the direction of the signal is from the second I/O terminal to the first I/O terminal.

9. The method of claim 7, wherein:
so long as the first pair of transistors are not prevented from turning on, step (a) comprises
(a.1) in response to a low to high transition at the first I/O terminal, temporarily turning on one of the transistors of the first pair of transistors, to thereby pull-up the second I/O terminal; and
(a.2) in response to a high to low transition at the first I/O terminal, temporarily turning on the other one of the transistors of the first pair of transistors, to thereby pull-down the second I/O terminal; and
so long as the second pair of transistors are not prevented from turning on, step (b) comprises
(b.1) in response to a low to high transition at the second I/O terminal, temporarily turning on one of the transistors of the second pair of transistors, to thereby pull-up the first I/O terminal; and
(b.2) in response to a high to low transition at the second I/O terminal, temporarily turning on the other one of the transistors of the second pair of transistors, to thereby pull-down the first I/O terminal.

10. A method for bi-directional buffering, comprising:
(a) using a first pair of one-shots to control the turning on of one transistor at a time, of a first pair of transistors, to enable a second input/output (I/O) terminal to follow a first I/O terminal; and
(b) using a second pair of one-shots to control the turning on of one transistor at a time, of a second pair of transistors, to enable the first I/O terminal to follow the second I/O terminal;
(c) detecting whether a direction of a signal is from the first I/O terminal to the second I/O terminal or vise versa from the second I/O terminal to the first I/O terminal;
(d) in response to detecting that the direction of the signal is from the first I/O terminal to the second I/O terminal, at least temporarily disabling the second pair of one-shots while the direction of the signal is from the first I/O terminal to the second I/O terminal to thereby at least temporarily prevent the turning on of the second pair of transistors while the direction of the signal is from the first I/O terminal to the second I/O terminal to thereby reduce feedback that may occur from the second I/O terminal to the first I/O terminal; and
(e) in response to detecting that the direction of the signal is from the second I/O terminal to the first I/O terminal, at least temporarily disabling the first pair of one-shots while the direction of the signal is from the second I/O terminal to the first I/O terminal to thereby at least temporarily prevent the turning on of the first pair of transistors while the direction of the signal is from the second I/O terminal to the first I/O terminal to thereby reduce feedback that may occur from the first I/O terminal to the second I/O terminal.

11. A bi-directional buffer, comprising:
a first pull-up transistor connected between a first input/output (I/O) terminal and a first high voltage rail;
a first pull-down transistor connected between the first I/O terminal and a first low voltage rail;
a second pull-up transistor connected between a second input/output (I/O) terminal and a second high voltage rail;
a second pull-down transistor connected between the second I/O terminal and a second low voltage rail;
a first pair of one-shots;
a second pair of one-shots;
a first buffer having an input connected to the first I/O terminal and an output connected to inputs of the first pair of one-shots;
a second buffer having an input connected to the second I/O terminal and an output connected to inputs of the second pair of one-shots;
wherein an output of one of the one-shots, of the first pair of one-shots, is connected to a control terminal of the first pull-up transistor;
wherein an output of the other one of the one-shots, of the first pair of one-shots, is connected to a control terminal of the first pull-down transistor;
wherein an output of one of the one-shots, of the second pair of one-shots, is connected to a control terminal of the second pull-up transistor;
wherein an output of the other one of the one-shots, of the second pair of one-shots, is connected to a control terminal of the second pull-down transistor.

12. The bi-directional buffer of claim 11, further comprising:
a direction detector that detects whether a direction of a signal is from the first I/O terminal to the second I/O terminal, or vise versa from the second I/O terminal to the first I/O terminal;
wherein the direction detector, in response to detecting that the direction of the signal is from the first I/O terminal to the second I/O terminal, at least temporarily disables the second pair of one-shots while the direction of the signal is from the first I/O terminal to the second I/O terminal to thereby reduce feedback that may occur from the second I/O terminal to the first I/O terminal; and
wherein the direction detector, in response to detecting that the direction of the signal is from the second I/O terminal to the first I/O terminal, at least temporarily disables the first pair of one-shots while the direction of the signal is from the second I/O terminal to the first I/O terminal to thereby reduce feedback that may occur from the first I/O terminal to the second I/O terminal.

13. The bi-directional buffer of claim 12, wherein the direction detector includes:
a first activity detector to monitor for activity at the outputs of the first pair of one-shots;
a second activity detector to monitor for activity at the outputs of the second pair of one-shots;
wherein the direction detector detects that the direction of the signal is from the first I/O terminal to the second I/O terminal when the first activity detector detects activity at either of the outputs of the first pair of one-shots; and
wherein the direction detector detects that the direction of the signal is from the second I/O terminal to the first I/O terminal when the second activity detector detects activity at either of the outputs of the second pair of one-shots.

14. The bi-directional buffer of claim 13, wherein:
the first activity detector disables the second pair of one-shots while activity is detected at the outputs of the first pair of one-shots; and
the second activity detector disables the first pair of one-shots while activity is detected at the outputs of the second pair of one-shots.

15. The bi-directional buffer of claim 11, further comprising:
a third buffer having an input connected to the output of the first buffer and having an output connected to the second I/O terminal; and
a fourth buffer having an input connected to the output of the second buffer and having an output connected to the first I/O terminal;
wherein the direction detector compares voltage logic levels at the input and the output of the third buffer, and compares voltage logic levels at the input and the output of the fourth buffer; and
wherein the direction detector detects that the direction of the signal is from the first I/O terminal to the second I/O terminal in response to detecting that the voltage logic level at the output of the fourth buffer is different than the voltage logic level at the input of the fourth buffer; and
wherein the direction detector detects that the direction of the signal is from the second I/O terminal to the first I/O terminal in response to detecting that the voltage logic level at the output of the third buffer is different than the voltage logic level at the input of the third buffer.

16. The bi-directional buffer of claim 15, wherein:
the direction detector disables the second pair of one-shots so long as the direction of the signal is from the first I/O terminal to the second I/O terminal; and
the direction detector disables the first pair of one-shots so-long as the direction of the signal is from the second I/O terminal to the first I/O terminal.

17. The bi-directional buffer of claim 11, wherein the first and second low voltage rails can be a common ground.

18. A bi-directional buffer, comprising:
a first pull-up transistor having a current path connected between a first input/output (I/O) terminal and a first high voltage rail;
a first pull-down transistor having a current path connected between the first I/O terminal and a first low voltage rail;
a second pull-up transistor having a current path connected between a second I/O terminal and a second high voltage rail;
a second pull-down transistor having a current path connected between the second I/O terminal and a second low voltage rail;
a first buffer having an input connected to the first I/O terminal and having an output;
a first one-shot having an input that receives the output of the first buffer, and having an output the drives a control terminal of the second pull-up transistor;
a second one-shot having an input that receives the output of the first buffer, and having an output that drives a control terminal of the second pull-down transistor;
a second buffer having an input connected to the second I/O terminal and having an output;
a third one-shot having an input that receives the output of the second buffer, and having an output the drives a control terminal of the first pull-up transistor;
a fourth one-shot having an input that receives the output of the second buffer, and having an output that drives a control terminal of the first pull-down transistor;
a direction detector that detects whether a direction of a signal is from the first I/O terminal to the second I/O terminal, or vise versa from the second I/O terminal to the first I/O terminal;
wherein the direction detector, in response to detecting that the direction of the signal is from the first I/O terminal to the second I/O terminal, at least temporarily prevents the turning on of the first pull-up transistor and the first pull-down transistor while the direction of the signal is from the first I/O terminal to the second I/O terminal; and
wherein the direction detector, in response to detecting that the direction of the signal is from the second I/O terminal to the first I/O terminal, at least temporarily prevents the turning on of the second pull-up transistor and the second pull-down transistor while the direction of the signal is from the second I/O terminal to the first I/O terminal.

19. The bi-directional buffer of claim 18, wherein the direction detector comprises:
a first activity detector that detects pulses produced by the first and second one-shots, and in response thereto, temporarily disables the third and fourth one-shots to thereby temporarily prevent the turning on of the first pull-up transistor and the first pull-down transistor; while the direction of the signal is from the first I/O terminal to the second I/O terminal and
a second activity detector that detects pulses produced by the third and fourth one-shots, and in response thereto, temporarily disables the first and second one-shots to thereby temporarily prevent the turning on of the second pull-up transistor and the second pull-down transistor while the direction of the signal is from the second I/O terminal to the first I/O terminal.

20. The bi-directional buffer of claim 18, wherein:
the direction detector disables the third and fourth one-shots so long as the direction of the signal is from the first I/O terminal to the second I/O terminal; and
the direction detector disables the first and second one-shots so-long as the direction of the signal is from the second I/O terminal to the first I/O terminal.

21. The bi-directional buffer of claim 18, wherein:
the first one-shot
normally produces a high output to normally turn off the second pull-up transistor, and
produces a low going pulse at its output, in response to detecting a transition from low to high at its input, to temporarily turn on the second pull-up transistor, causing the second I/O terminal to be pulled up to the voltage of the second high voltage rail;
the second one-shot
normally produces a low output to normally turn off the second pull-down transistor, and
produces a high going pulse at its output, in response to detecting a transition from high to low at its input, to temporarily turn on the second pull-down transistor, causing the second I/O terminal to be pulled down to the voltage of the second low voltage rail;
the third one-shot
normally produces a high output to normally turn off the first pull-up transistor, and
produces a low going pulse at its output, in response to detecting a transition from low to high at its input, to temporarily turn on the first pull-up transistor, causing the first I/O terminal to be pulled up to the voltage of the first high voltage rail;
the fourth one-shot
normally produces a low output to normally turn off the first pull-down transistor, and
produces a high going pulse at its output, in response to detecting a transition from high to low at its input, to temporarily turn on the first pull-down transistor, causing the first I/O terminal to be pulled down to the voltage of the first low voltage rail.

22. The method of claim 7, wherein:
step (d) comprises in response to detecting that the direction of the signal is from the first I/O terminal to the second I/O terminal, at least temporarily preventing the turning on of the second pair of transistors by at least temporarily disabling a pair of one-shots while the direction of the signal is from the first I/O terminal to the second I/O terminal to thereby reduce feedback that may occur from the second I/O terminal to the first I/O terminal; and
step (e) comprises in response to detecting that the direction of the signal is from the second I/O terminal to the first I/O terminal, at least temporarily preventing the turning on of the first pair of transistors by at least temporarily disabling a further pair of one-shots while the direction of the signal is from the second I/O terminal to the first I/O terminal to thereby reduce feedback that may occur from the first I/O terminal to the second I/O terminal.

23. The method of claim 7, wherein:
outputs of a first pair of one-shots drive control terminals of the first pair of transistors;
outputs of a second pair of one-shots drive control terminals of a second pair of transistors;

step (d) comprises in response to detecting that the direction of the signal is from the first I/O terminal to the second I/O terminal, at least temporarily preventing the turning on of the second pair of transistors by at least temporarily disabling the second pair of one-shots while the direction of the signal is from the first I/O terminal to the second I/O terminal to thereby reduce feedback that may occur from the second I/O terminal to the first I/O terminal; and step (e) comprises in response to detecting that the direction of the signal is from the second I/O terminal to the first I/O terminal, at least temporarily preventing the turning on of the first pair of transistors by at least temporarily disabling the first pair of one-shots while the direction of the signal is from the second I/O terminal to the first I/O terminal to thereby reduce feedback that may occur from the first I/O terminal to the second I/O terminal.

* * * * *

UNITED STATES PATENT AND TRADEMARK OFFICE
CERTIFICATE OF CORRECTION

| | | |
|---|---|---|
| PATENT NO. | : 7,639,045 B2 | |
| APPLICATION NO. | : 12/177736 | |
| DATED | : December 29, 2009 | |
| INVENTOR(S) | : Motamed et al. | |

It is certified that error appears in the above-identified patent and that said Letters Patent is hereby corrected as shown below:

In claim 10, at column 17, line 13, after "second I/O terminal" insert --,--.

Signed and Sealed this
Twenty-sixth Day of April, 2011

David J. Kappos
*Director of the United States Patent and Trademark Office*